US012568833B2

(12) United States Patent
Ohba et al.

(10) Patent No.: US 12,568,833 B2
(45) Date of Patent: Mar. 3, 2026

(54) SEMICONDUCTOR DEVICE HAVING WIRING PART WITHOUT BEING EXPOSED FROM SUBSTRATE

(71) Applicants: TOKYO INSTITUTE OF TECHNOLOGY, Tokyo (JP); ADVANTEST CORPORATION, Tokyo (JP)

(72) Inventors: Takayuki Ohba, Tokyo (JP); Shinji Sugatani, Saitama (JP)

(73) Assignees: TOKYO INSTITUTE OF TECHNOLOGY, Tokyo (JP); ADVANTEST CORPORATION, Tokyo (JP)

( * ) Notice: Subject to any disclaimer, the term of this patent is extended or adjusted under 35 U.S.C. 154(b) by 476 days.

(21) Appl. No.: 17/810,026

(22) Filed: Jun. 30, 2022

(65) Prior Publication Data
US 2023/0021125 A1 Jan. 19, 2023

(30) Foreign Application Priority Data
Jul. 9, 2021 (JP) ................................. 2021-113963

(51) Int. Cl.
*H01L 23/498* (2006.01)
(52) U.S. Cl.
CPC .. *H01L 23/49838* (2013.01); *H01L 23/49822* (2013.01)
(58) Field of Classification Search
CPC ......... H01L 23/49838; H01L 23/49822; H01L 24/80; H01L 21/78; H01L 23/481;
(Continued)

(56) References Cited

U.S. PATENT DOCUMENTS

2003/0051910 A1* 3/2003 Dyke ................ H01L 23/49838
257/E23.079
2009/0085217 A1 4/2009 Knickerbocker et al.
(Continued)

FOREIGN PATENT DOCUMENTS

CN 108682663 A * 10/2018 ........... H01L 23/373

OTHER PUBLICATIONS

Venkatesh, V. C., et al. "Observations on polishing and ultraprecision machining of semiconductor substrate materials." CIRP annals 44.2 (1995): 611-618. (Year: 1995).*
(Continued)

*Primary Examiner* — Norman D Richards
*Assistant Examiner* — Ethan Edward Cutler
(74) *Attorney, Agent, or Firm* — IPUSA, PLLC

(57) ABSTRACT

A semiconductor device includes a power supply and ground layer and a semiconductor chip disposed over the power supply and ground layer. The power supply and ground layer includes a substrate and a wiring part. The substrate has one or more grooves whose openings are directed toward the semiconductor chip, and the wiring part is disposed within the one or more grooves via an insulating layer and is formed in a predetermined pattern. The substrate is connected to ground wiring of the semiconductor chip and the wiring part is connected to power supply wiring of the semiconductor chip. The wiring part is not exposed from a back surface of the substrate.

15 Claims, 18 Drawing Sheets

1B

(58) Field of Classification Search
CPC ............. H01L 23/5286; H01L 25/0652; H01L
25/0655; H01L 2225/06541; H01L
2225/06589; H01L 25/0657; H01L 25/50;
H01L 29/94; H01L 23/147; H01L 23/50
See application file for complete search history.

(56) References Cited

U.S. PATENT DOCUMENTS

| | | | |
|---|---|---|---|
| 2011/0042795 A1* | 2/2011 | Knickerbocker | ............................ H01L 23/49827 257/E21.585 |
| 2016/0099229 A1* | 4/2016 | Choi | ................. H01L 21/76898 257/737 |
| 2018/0240760 A1* | 8/2018 | Kasai | ...................... H01L 23/12 |
| 2020/0098676 A1* | 3/2020 | Elsherbini | ............... H01L 23/36 |
| 2022/0230918 A1* | 7/2022 | Ejiri | ................. H01L 21/76883 |

OTHER PUBLICATIONS

H. Sonoda et al., in Proc. IEDM 2020, 31.5, pp. 685-688, Dec. 2020, Japan, "Secure 3D CMOS Chip Stacks with Backside Buried Metal Power Delivery Networks for Distributed Decoupling Capacitance".
Office Action mailed on Mar. 11, 2025 issued with respect to the basic Japanese patent application No. 2021-113963.

* cited by examiner $60_3$ $30_4$ $10_4$ $60_4$ $30_3$ $10_3$ $60_3$

1D $60_4$ $30_3$ $10_3$ $60_3$

FIG.24A
FIG.24B
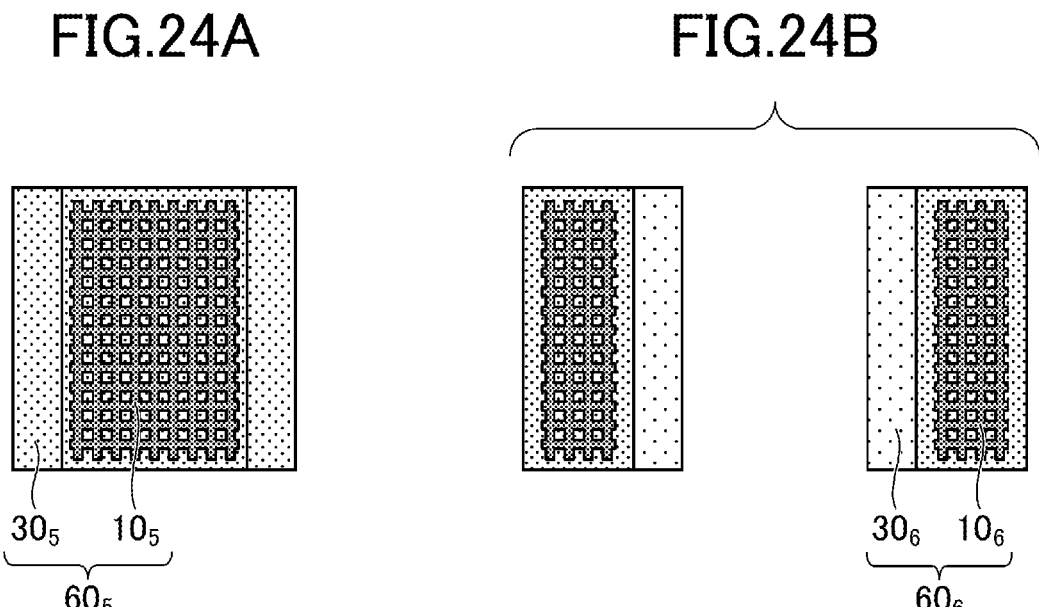
$30_5$    $10_5$
$60_5$
$30_6$    $10_6$
$60_6$
FIG.24C
1E
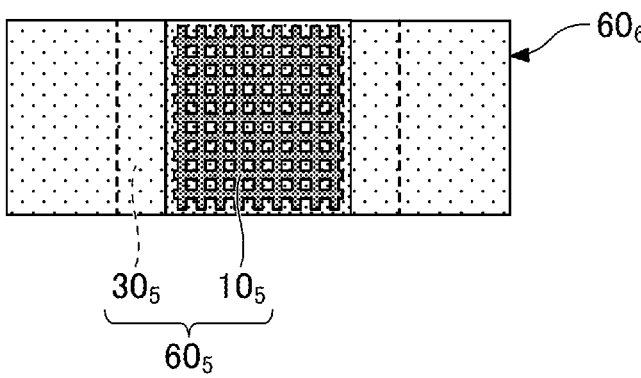
$60_6$
$30_5$    $10_5$
$60_5$ $30_7$ $10_7$ $60_7$ $30_8$ $10_8$ $60_8$

1E $60_8$ $30_7$ $10_7$ $60_7$

1G $30_9$　　　$30_{10}$　　　$10_9$

SEMICONDUCTOR DEVICE HAVING WIRING PART WITHOUT BEING EXPOSED FROM SUBSTRATE

CROSS-REFERENCE TO RELATED APPLICATIONS

This application is based on and claims priority to Japanese Patent Application No. 2021-113963, filed on Jul. 9, 2021, the entire contents of which are incorporated herein by reference.

BACKGROUND OF THE INVENTION

1. Field of the Invention

The present disclosure relates to a semiconductor device.

2. Description of the Related Art

In semiconductor devices, the degree of integration generally increases as the generation progresses, thereby resulting in a decrease in the load capacity and a decrease in the power supply voltage. As a result, power consumption per circuit size is reduced. Even if the degree of integration increases, the heat density does not necessarily decrease, but rather the heat density tends to increase. For future semiconductor devices, it is desirable to stabilize the power supply and improve heat dissipation performance.

Conventionally, a semiconductor device having a structure in which a silicon substrate is processed from the back surface side is known. In this structure, metal wiring for power supply is formed on the back surface side of the silicon substrate, and the bottom surface of the power supply metal wiring is exposed from the back surface of the silicon substrate. The metal wiring is connected to other wiring via through-wiring provided in the silicon substrate (see Non-Patent Document 1, for example).

However, the semiconductor device having the above-described structure does not have a heat dissipation mechanism. Therefore, while some degree of power supply stabilization can be obtained, sufficient heat dissipation efficiency cannot be expected.

RELATED-ART DOCUMENTS

Non-Patent Documents

Non-Patent Document 1: H. Sonoda, et al., in Proc. IEDM 2020, 31.5, pp. 685-688, Dec. 2020.

SUMMARY OF THE INVENTION

The present invention has been made in view of the above, and is intended to provide a semiconductor device that stabilizes the power supply and improves heat dissipation performance.

According to one embodiment of the present invention, a semiconductor device includes a power supply and ground layer and a semiconductor chip disposed over the power supply and ground layer. The power supply and ground layer includes a substrate and a wiring part. The substrate has one or more grooves whose openings are directed toward the semiconductor chip, and the wiring part is disposed within the one or more grooves via an insulating layer and is formed in a predetermined pattern. The substrate is connected to ground wiring of the semiconductor chip and the wiring part is connected to power supply wiring of the semiconductor chip. The wiring part is not exposed from a back surface of the substrate.

BRIEF DESCRIPTION OF THE DRAWINGS

Other objects and further features of the present invention will be apparent from the following detailed description when read in conjunction with the accompanying drawings, in which:

FIG. 24A through FIG. 24C are plan views of a semiconductor device according to a third application example of the first embodiment;

DESCRIPTION OF THE EMBODIMENTS

Figure 1:
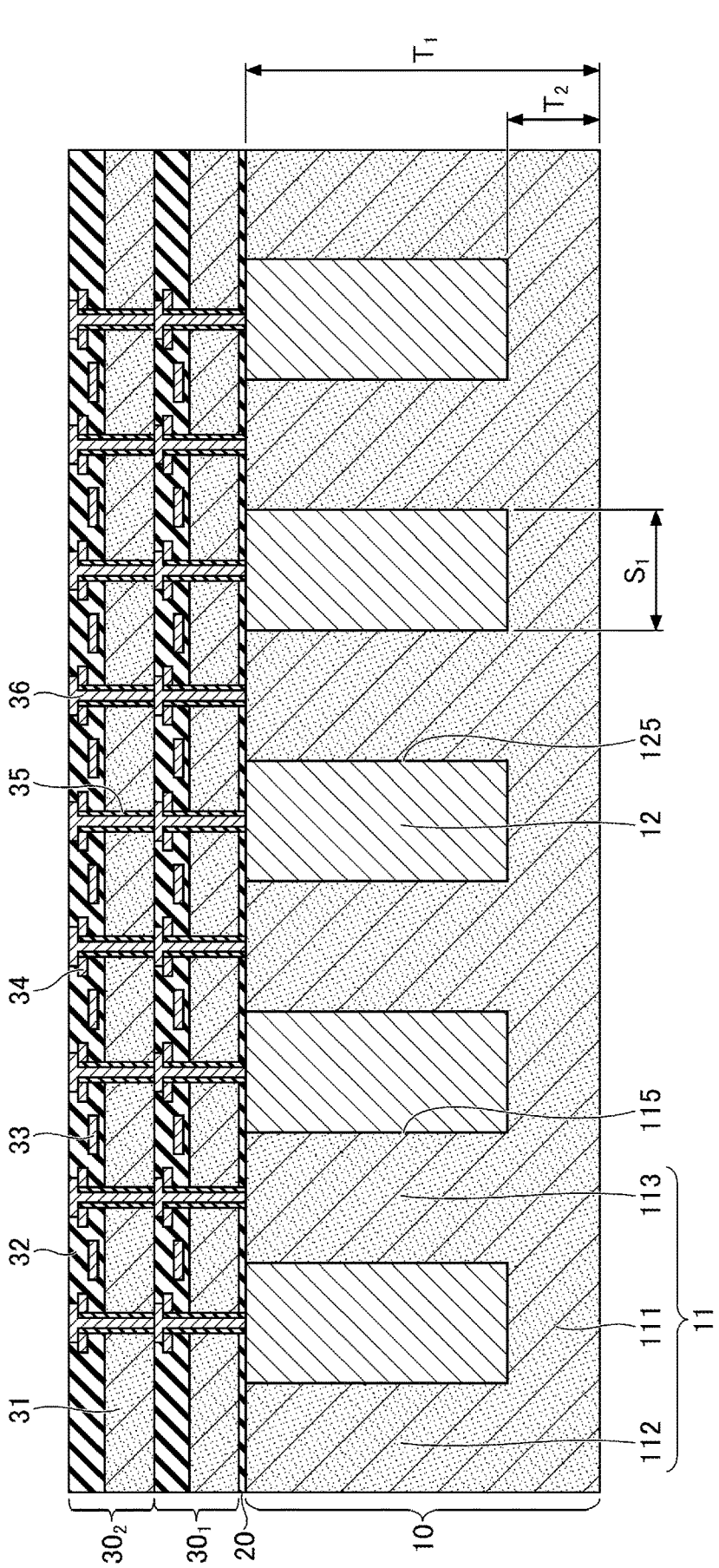
FIG. 1 is a cross-sectional view of a semiconductor device according to a first embodiment.

According to one embodiment of the present invention, a semiconductor device that stabilizes the power supply and improves heat dissipation performance can be provided.

In the following, embodiments of the present invention will be described with reference to the accompanying drawings. In the drawings, the same elements are denoted by the same reference numerals and the description thereof may be omitted.

First Embodiment

[Semiconductor Device Structure]

FIG. 1 is a cross-sectional view of a semiconductor device according to a first embodiment. Referring to FIG. 1, the semiconductor device 1 according to the first embodiment includes a power supply and ground layer 10, an insulating layer 20, and semiconductor chips $30_1$ and $30_2$. The semiconductor chips $30_1$ and $30_2$ are sequentially stacked on the power supply and ground layer 10 via the insulating layer 20. The semiconductor chips $30_1$ and $30_2$ are stacked while causing the main surfaces of the semiconductor chips (on the sides of the semiconductor chips on which electrode pads are formed) to face in the same direction. In the semiconductor device 1, different layers of semiconductor chips can communicate a signal to each other and can supply power through the connection of through-electrodes 36. Three or more layers of semiconductor chips may be stacked on the power supply and ground layer 10. Further, a stack of semiconductor chips is not necessarily disposed on the power supply and ground layer 10, and one layer of a semiconductor chip may be disposed on the power supply and ground layer 10. Alternatively, a plurality of semiconductor chips may be disposed at different positions on the power supply and ground layer 10 in a plan view. In this case, a stack of semiconductor chips may be disposed, one layer of a semiconductor chip may be disposed, or a combination of a stack of semiconductor chips and one layer of a semiconductor chip may be disposed.

Figure 2:
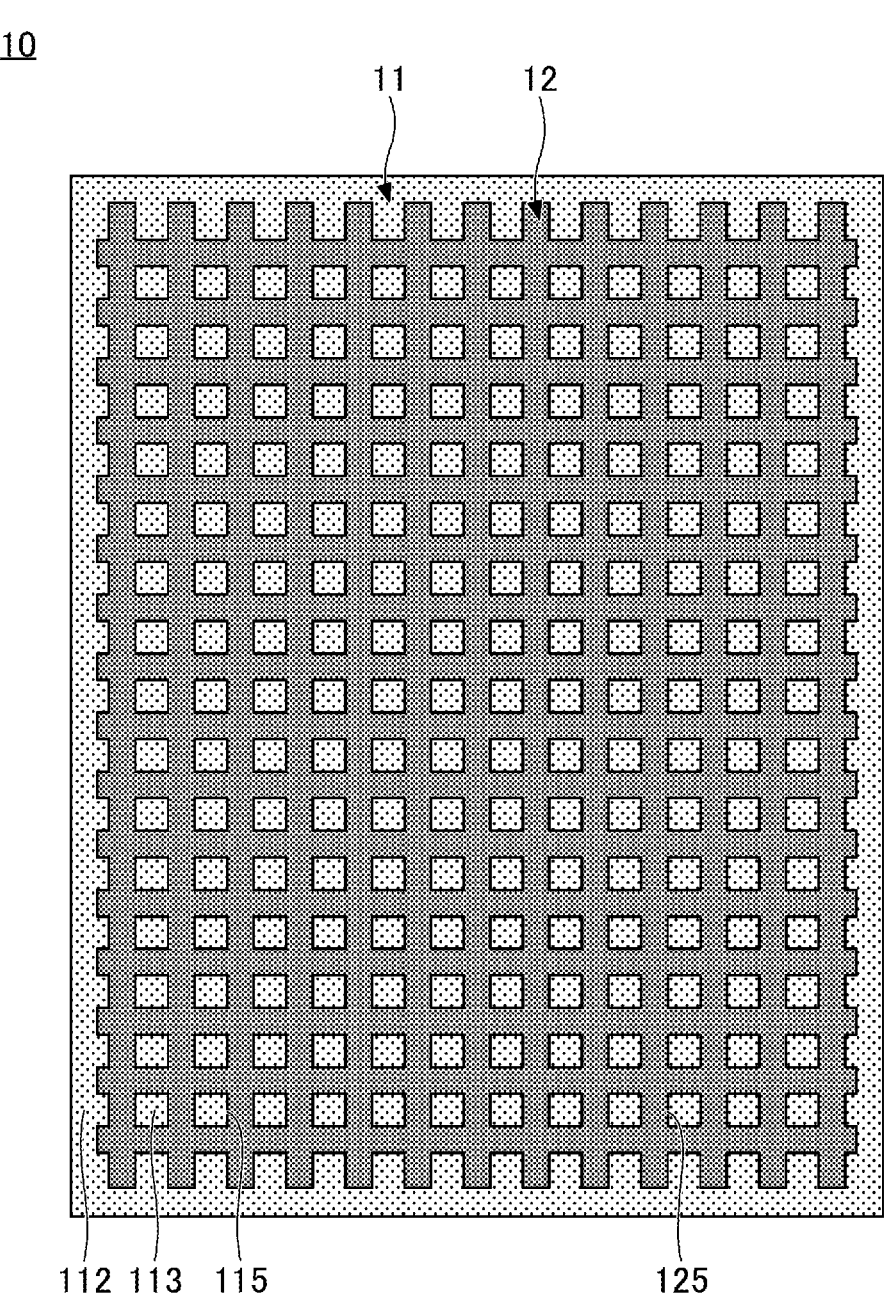
FIG. 2 is a plan view of a power supply and ground layer.
Figure 3:
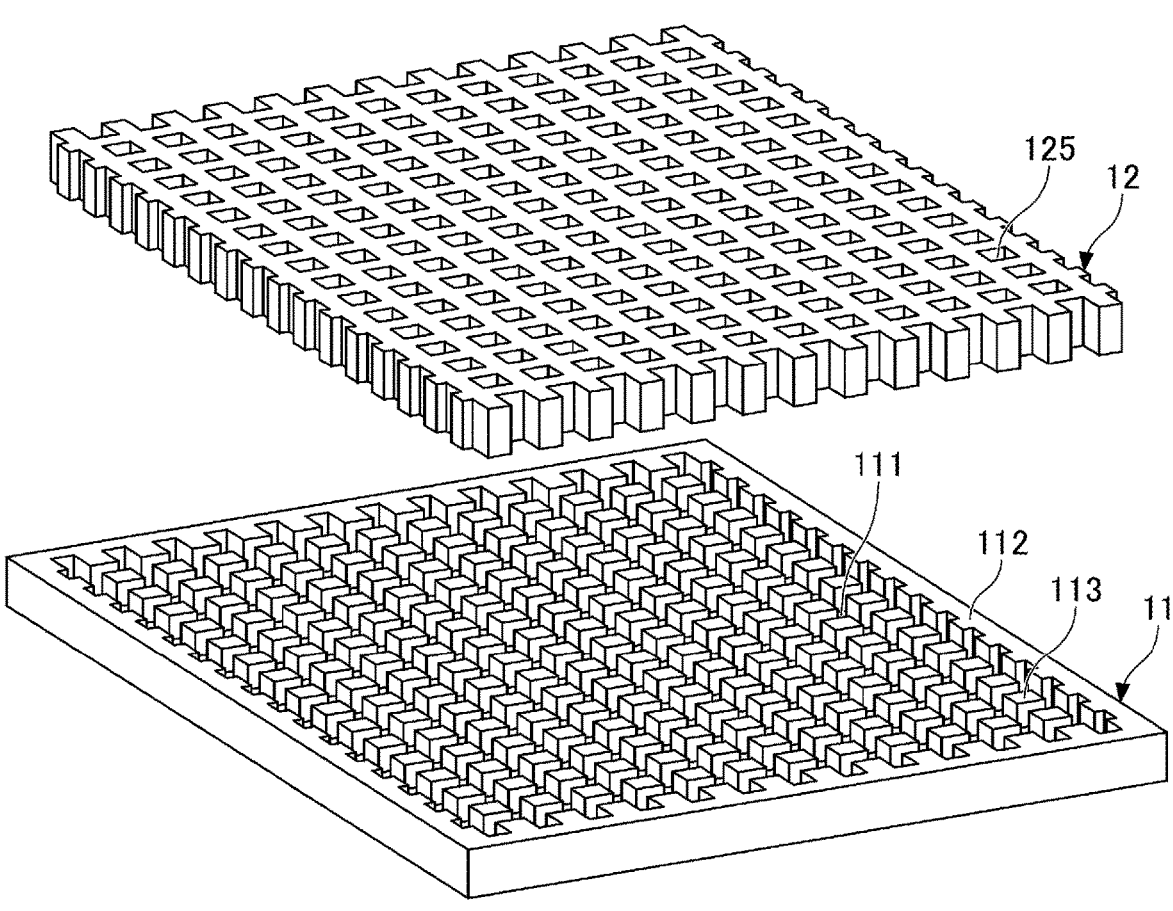
FIG. 3 is a perspective view of the power supply and ground layer.

FIG. 2 is a plan view of the power supply and ground layer. FIG. 3 is a perspective view of the power supply and ground layer, and schematically illustrates an exploded structure of a substrate connected to ground wiring of a semiconductor chip and a wiring part connected to power supply wiring of the semiconductor chip. Note that the power supply and ground layer illustrated in FIG. 1 is simplified as compared to those illustrated in FIG. 2 and FIG. 3.

Referring to FIG. 1 through FIG. 3, the power supply and ground layer 10 includes a substrate 11 and a wiring part 12. The substrate 11 has a structure in which grooves 115 are formed in an electrically conductive plate, and the openings of the grooves 115 are directed towards the semiconductor chip $30_1$. The substrate 11 includes a bottom portion 111, a side wall portion 112 having a frame shape and surrounding the bottom portion 111, and a plurality of columnar portions 113. The columnar portions 113 are disposed in a region on the bottom portion 111 surrounded by the side wall portion 112 while being spaced apart from each other.

For example, the columnar portions 113 are arranged vertically and horizontally and spaced apart from each other. Each of the columnar portions 113 has, for example, a square shape in a plan view, but may have any shape such as a rectangular shape or a circular shape in a plan view. The top surface of each of the columnar portions 113 is substantially coplanar with the top surface of the side wall portion 112. Gaps between each of the columnar portions 113 and the side wall portion 112 and gaps between adjacent columnar portions 113 are the grooves 115.

A suitable material for the substrate 11 may include a semiconductor material having relatively high rigidity, such as silicon or diamond, in order to ensure sufficient strength of the substrate 11. The thickness T1 of the substrate 11 may be, for example, 100 μm or more and 300 μm or less. The thickness T2 of the bottom portion 111 may be, for example, 10 μm or more and 30 μm or less. The distance S1 between two adjacent columnar portions 113 may be, for example, 10 μm or more and 30 μm or less.

If the substrate 11 is formed of silicon, the volume of the silicon is preferably 60% or less of the total volume of the silicon and the wiring part 12. Accordingly, high thermal conductivity can be provided.

The wiring part 12 is disposed within the grooves 115 via an insulating layer (not illustrated). That is, the wiring part 12 is isolated from the substrate 11 by the insulating layer. Note that the insulating layer and a barrier layer may be provided between the substrate 11 and the wiring part 12. A decoupling capacitor is formed by the substrate 11, the insulating layer, and the wiring part 12. Accordingly, the power supply of the semiconductor device 1 can be stabilized.

The wiring part 12 has a pattern in which a plurality of openings 125 are arranged vertically and horizontally. The columnar portions 113 of the substrate 11 are disposed within the respective openings 125. The top surface of the wiring part 12 is substantially coplanar with the top surface of the side wall portion 112 and the top surface of each of the columnar portions 113. The wiring part 12 is not exposed from the back surface of the substrate 11. That is, the back surface of the semiconductor device 1 includes the bottom portion 111 of the substrate 11 only.

The pattern of the wiring part 12 having the plurality of openings 125 may be, for example, a mesh pattern in a plan view. As used herein, the mesh pattern refers to a pattern in which the plurality of openings 125 are formed by intersecting lines. The intersecting lines are not necessarily straight lines. Further, the intersecting lines are not necessarily orthogonal to each other. In the present application, a pattern in which the intersecting lines are straight lines and are orthogonal to each other is referred to as a grid pattern.

The openings 125 may have any shape such as a square shape, a rectangular shape or a circular shape in a plan view according to the shape of the columnar portions 113 in a plan view. In the example illustrated in FIG. 2, the wiring part 12 is formed in a grid pattern in which a plurality of horizontally-arranged straight lines intersect a plurality of vertically-arranged straight lines. That is, each of the openings 125 has an approximately square shape in a plan view.

The wiring part 12 preferably includes a metal material having relatively high electrical conductivity and thermal conductivity, such as copper, such that electrical characteristics and heat dissipation performance can be ensured. Instead of copper, a metal such as silver (Ag) or aluminum (Al) may be used as the material of the wiring part 12. The thickness of the wiring part 12 is the same as the depth of the grooves 115 of the substrate 11. The width of a portion sandwiched between adjacent columnar portions 113 is the same as the distance S1 between the adjacent columnar portions 113, and is, for example 10 μm or more and 30 μm or less.

Referring back to FIG. 1, the semiconductor chip 30₁ is stacked on the power supply and ground layer 10 via the insulating layer 20. Further, the semiconductor chip 30₂ is stacked on the semiconductor chip 30₁. As the material of the insulating layer 20, a high dielectric material such as SiO₂, SiON, Si₃N₄, or a hafnium oxide film may be used. The thickness of the insulating layer 20 may be, for example, approximately 0.05 μm to 0.5 μm.

Each of the semiconductor chip 30₁ and the semiconductor. chip 30₂ includes a substrate 31, an insulating layer 32, a wiring layer 33, an electrode pad 34, an insulating layer 35, and a through-electrode 36. The substrate 31 of each of the semiconductor chip 30₁ and the semiconductor chip 30₂ is thinned, and the thickness of the substrate 31 of each of the semiconductor chip 30₁ and the semiconductor chip 30₂ may be, for example, 0.2 μm or more and 5 μm or less.

In each of the semiconductor chip 30₁ and the semiconductor chip 30₂, the substrate 31 is composed of, for example, silicon, gallium nitride, silicon carbide, and the like. Although not illustrated, a semiconductor integrated circuit is formed on the main surface side of the substrate 31. The semiconductor integrated circuit may include, for example, a plurality of field-effect transistors having drains, gates, and sources, and the field-effect transistors may be separated by isolation layers.

The insulating layer 32 is formed on one surface of the substrate 31. Although simplified in FIG. 1, the wiring layer 33 is formed in the insulating layer 32. The wiring layer 33 is formed of copper or the like, and includes a plurality of layers of horizontal wiring and vertical wiring. Different layers of horizontal wiring are connected to each other by vertical wiring as appropriate. The electrode pads 34 are disposed at the uppermost layer of the wiring layer 33, and are electrically connected to lower layers of the wiring layer 33.

In each of the semiconductor chip 30₁ and the semiconductor chip 30₂, a part of the through-electrode 36 is formed in the top surface of the electrode pad 34, and the top surface of the through-electrode 36 is exposed to the surface of the insulating layer 32. Note that the electrode pad 34 and the part of the through-electrode 36, formed in the top surface of the electrode pad 34, may be simply collectively referred to as an electrode pad.

The electrode pad 34 and the part of the through-electrode 36, formed in the top surface of the electrode pad 34, may have a rectangular shape or a circular shape in a plan view. If the electrode pad 34 has a circular shape in a plan view, the diameter of the electrode pad 34 may be, for example, approximately 3 μm to 10 μm. The shape of the part of the through-electrode 36, formed in the top surface of the electrode pad 34, is slightly smaller than the shape of the electrode pad 34 in a plan view.

The material of the electrode pad 34 may be, for example, copper. The electrode pad 34 may have a structure including a plurality of stacked metals. Specifically, for example, the electrode pad 34 may be a stack formed by stacking an Au layer, an Al layer, a Cu layer, or the like on a Ti layer or a TiN layer. The electrode pad 34 may be a stack formed by stacking an Au layer on a Ni layer, a stack formed by sequentially stacking a Pd layer and an Au layer on a Ni layer, or a stack or a wiring layer having a damascene structure formed by using a layer having a high melting point metal, such as Co, Ta, Ti, or TiN, instead of Ni, and stacking a Cu layer or an Al layer on the layer.

In each of the semiconductor chip 30₁ and the semiconductor chip 30₂, an insulating layer serving as a barrier layer may be provided on the back surface of the substrate 31. In this case, for example, SiO₂, SiON, Si₃N₄, or the like may be used as the material of the insulating layer. The thickness of the insulating layer may be, for example, approximately 0.05 μm to 0.5 μm. By forming the insulating layer (barrier layer) on the back surface of the substrate 31, the risk of each of the semiconductor chip 30₁ and the semiconductor chip 30₂ being contaminated by metal impurities from the back surface side can be reduced. In addition, if there are upper-side and lower-side semiconductor chips, such an insulating layer allows the upper-side semiconductor chip to be isolated from the lower-side semiconductor chip.

The upper-side and lower-side semiconductor chips adjacent to each other are joined directly without, for example, an adhesive layer or the like, but may be joined through an adhesive layer or the like as necessary (for example, if the surface of the semiconductor integrated circuit is not flat).

The semiconductor chip 30₁ has a via hole that penetrates through the insulating layer 32 and the substrate 31 of the semiconductor chip 30₁, further penetrates through the insulating layer 20, and exposes the top surface of the substrate 11 or the top surface of the wiring part 12 of the power supply and ground layer 10. The insulating layer 35 of the semiconductor chip 30₁ is provided on the inner wall (the side wall) of the via hole. The semiconductor chip 30₂ has a via hole that penetrates through the insulating layer 32 and the substrate 31 of the semiconductor chip 30₂, and exposes the top surface of the through-electrode 36 of the semiconductor chip 30₁. The insulating layer 35 of the semiconductor chip 30₂ is provided on the inner wall (the side wall) of the via hole. For example, SiO₂, SiON, Si₃N₄, or the like may be used as the material of the insulating layer 35. The thickness of the insulating layer 35 may be, for example, approximately 0.05 μm to 0.5 μm.

The inside of the insulating layer 35 of each of the semiconductor chip 30₁ and the semiconductor chip 30₂ is filled with the through-electrode 36. Electrode pads 34 of the semiconductor chips are directly and electrically connected to each other via the through-electrode 36. The through-electrode 36, excluding the part formed in the top surface of the electrode pad 34, has a circular shape or a polygonal shape in a plan view. If the through-electrode 36, excluding the part formed in the top surface of the electrode pad 34, has a circular shape in a plan view, the diameter may be, for example, approximately 0.3 μm to 5 μm.

In the semiconductor chip 30₁, at least some of through-electrodes 36, which are connected to the ground wiring of the semiconductor chip 30₁, penetrate through the insulating layer 20, the end faces of the through-electrodes 36 are electrically connected to the substrate 11 of the power supply and ground layer 10. Further, at least some of through-electrodes 36, which are connected to the power supply wiring of the semiconductor chip 30₁, penetrate through the insulating layer 20, and the end faces of the through-electrodes 36 are electrically connected to the wiring part 12 of the power supply and ground layer 10.

The total area of the end faces of the through electrodes 36 connected to the substrate 11 or to the wiring part 12 is preferably 2% or more of the area of the back surface of the semiconductor chip $30_1$. Accordingly, sufficient heat can be-transferred from the semiconductor chip $30_1$ to the power supply and ground layer 10. In addition, the connection between the substrate 11 and the ground wiring of the semiconductor chip $30_1$ and the connection between the wiring part 12 and the power supply wiring of the semiconductor chip $30_1$ can be securely made with low resistance.

The material of each of the through-electrodes 36 may be, for example, copper. Each of the through-electrodes 36 may have a structure including a plurality of stacked metals. Specifically, for example, each of the through-electrodes 36 may be a stack formed by stacking an Au layer, an Al layer, a Cu layer, or the like on a Ti layer or a TiN layer. Each of the through-electrodes 36 may be a stack formed by stacking an Au layer on a Ni layer, a stack formed by sequentially stacking a Pd layer and an Au layer on a Ni layer, or a stack or a wiring layer having a damascene structure formed by using a layer having a high melting point metal, such as Co, Ta, Ti, or TiN, instead of Ni, and stacking a Cu layer or an Al layer on the layer.

[Semiconductor Device Manufacturing Process]

Figure 4:
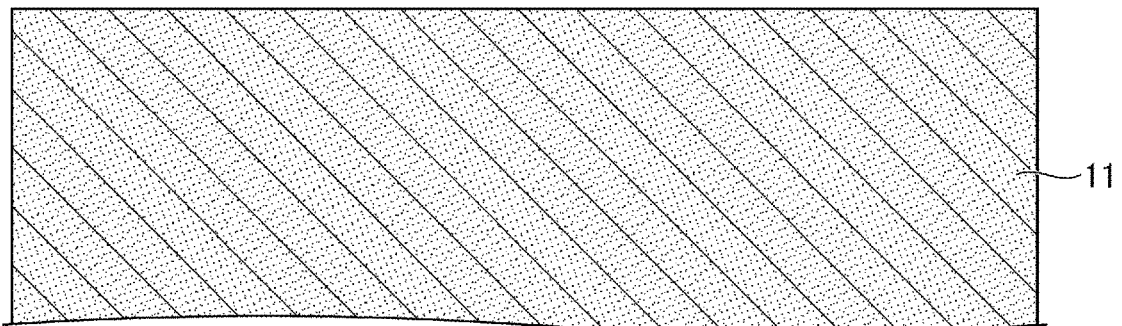
FIG. 4 is a first diagram illustrating a manufacturing process of the semiconductor device according to the first embodiment.
Figure 16:
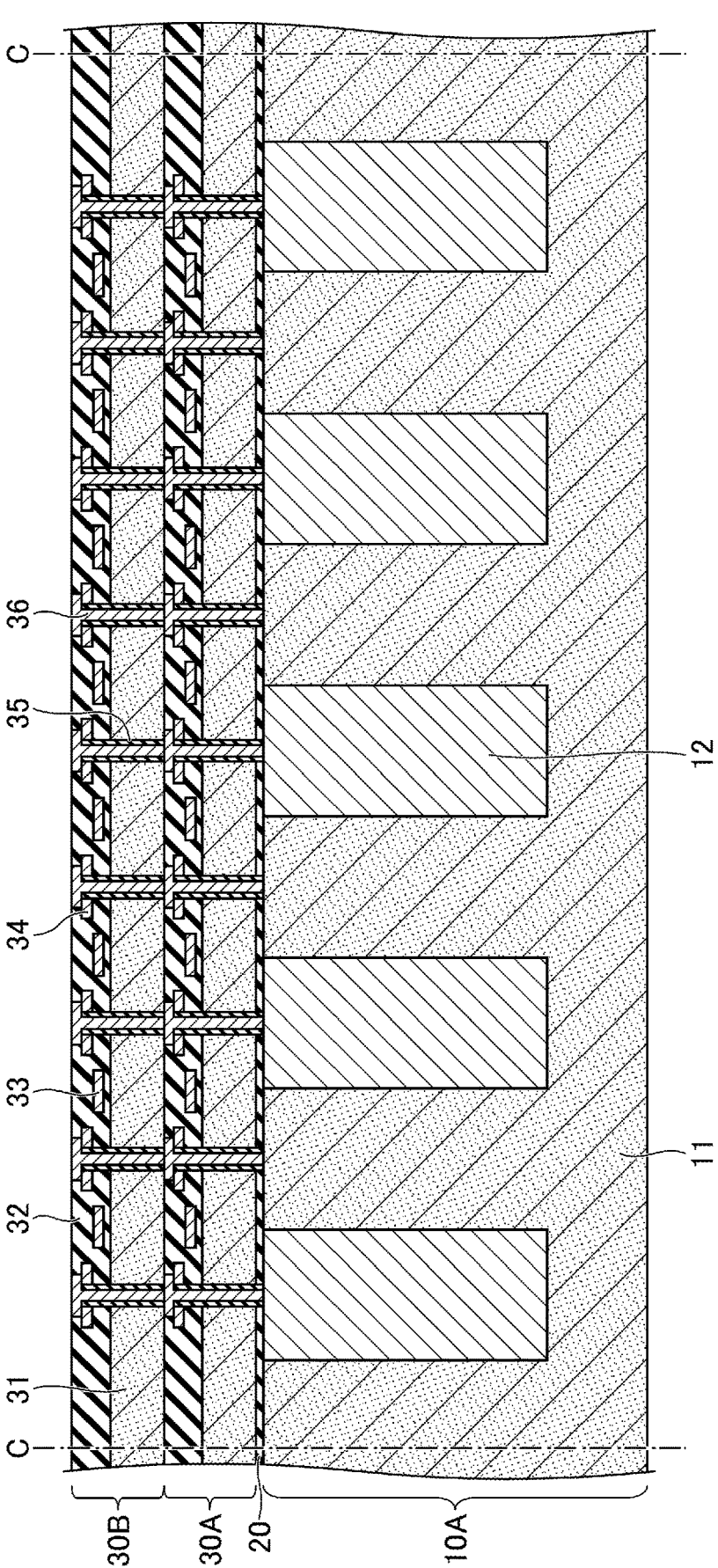
FIG. 16 is a thirteenth diagram illustrating the manufacturing process of the semiconductor device according to the first embodiment.

Next, a manufacturing process of the semiconductor device according to the first embodiment will be described. FIG. 4 through to FIG. 16 are diagrams illustrating the manufacturing process of the semiconductor device according to the first embodiment. In the following, what is known as a wafer-on-wafer technique is used to stack semiconductor chips; however, what is known as a chip-on-wafer technique may be used. As described above, a stack of semiconductor chips is not necessarily disposed on the power supply and ground layer, and one layer of a semiconductor chip may be disposed on the power supply and ground layer. Alternatively, a plurality of semiconductor chips may be disposed at different positions on the power supply and ground layer 10 in a plan view. In this case, a stack of semiconductor chips may be disposed, one layer of a semiconductor chip may be disposed, or a combination of a stack of semiconductor chips and one layer of a semiconductor chip may be disposed.

First, in a process illustrated in FIG. 4, a substrate 11 is prepared. As an example, the substrate 11 is a silicon wafer. The silicon wafer may have, for example, a circular shape. The diameter of the silicon wafer may be, for example, 6 inches (approximately 150 mm), 8 inches (approximately 200 mm), 12 inches (approximately 300 mm) or the like. The thickness of the substrate 11 may be, for example, 0.625 mm (if the diameter is 6 inches), 0.725 mm (if the diameter is 8 inches), 0.775 mm (if the diameter is 12 inches), or the like.

The surface of the substrate 11 ultimately contacts through-electrodes. Therefore, the impurity concentration of the surface of the substrate 11 is preferably high, and is preferably $10^{20}$ cm$^{-3}$ or more, for example. Ions may be implanted into the surface of the substrate 11. The substrate 11 may be doped with a p-type impurity such as boron. The substrate 11 is preferably doped with phosphorus as an n-type impurity in terms of capacitance, which will be described later.

Figure 5:
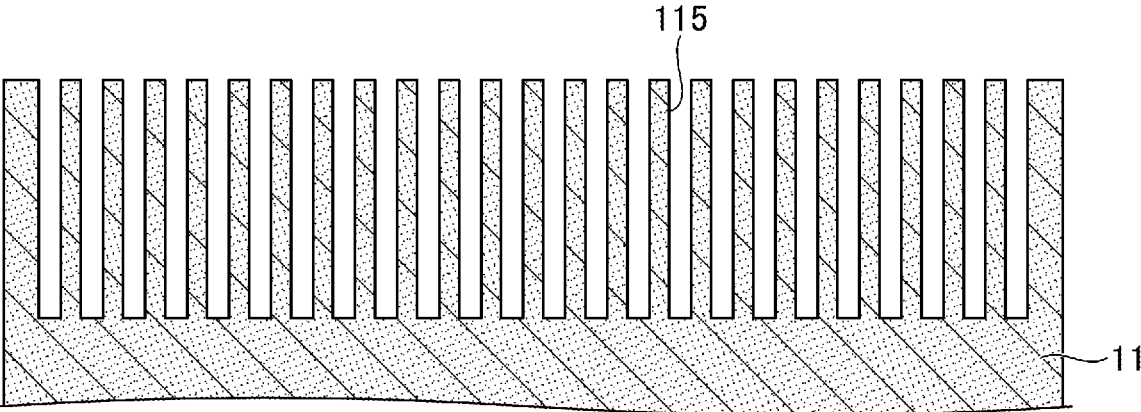
FIG. 5 is a second diagram illustrating the manufacturing process of the semiconductor device according to the first embodiment.

First, in a process illustrated in FIG. 5, grooves 115 are formed in the substrate 11. The grooves 115 can be formed by, for example, dry etching or the like. As an example, the grooves 115 are formed in a mesh pattern as illustrated in FIG. 3. The width of each of the grooves 115 may be, for example, 20 μm, and the depth of each of the grooves 115 may be, for example, 180 μm.

Figure 6:
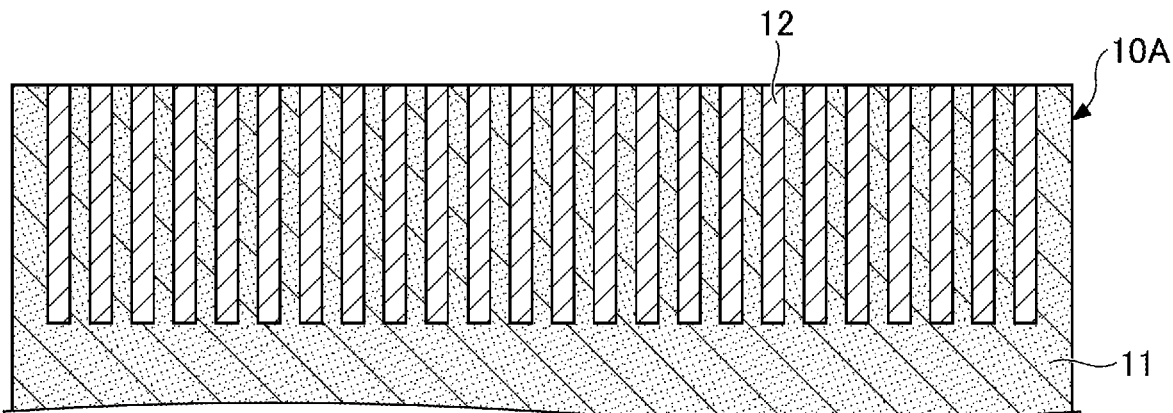
FIG. 6 is a third diagram illustrating the manufacturing process of the semiconductor device according to the first embodiment.

Next, in a process illustrated in FIG. 6, a wiring part 12 is formed in the grooves 115 of the substrate 11. Specifically, the bottom surfaces and the inner wall surfaces of the grooves 115 are coated with an insulating layer, such as a silicon oxide film. The insulating layer may have a thicknesses of approximately 200 nm, and may be formed by plasma CVD or the like. Subsequently, a barrier metal layer such as copper is formed so as to coat the insulating layer. Further, a seed layer is formed by stacking tantalum nitride and copper. The barrier metal layer and the seed layer can be formed by, for example, a sputtering method or the like. Next, an electrolytic plating layer, made of copper or the like, is formed so as to protrude from the top surface of the substrate 11 by an electrolytic plating method allowing electrical power to be supplied from the seed layer. Then, the electrolytic plating layer protruding from the top surface of the substrate 11 is removed by CMP or the like. The top surface of the substrate 11 may be, for example, coplanar with the top surface of the wiring part 12. Subsequently, annealing and sintering are preferably carried out under appropriate conditions. Accordingly, a power supply and ground layer 10A including the wiring part 12 within the grooves 115 and having a plurality of regions to be separated is produced. Each of the separated regions serves as a power supply and ground layer 10.

Figure 7:
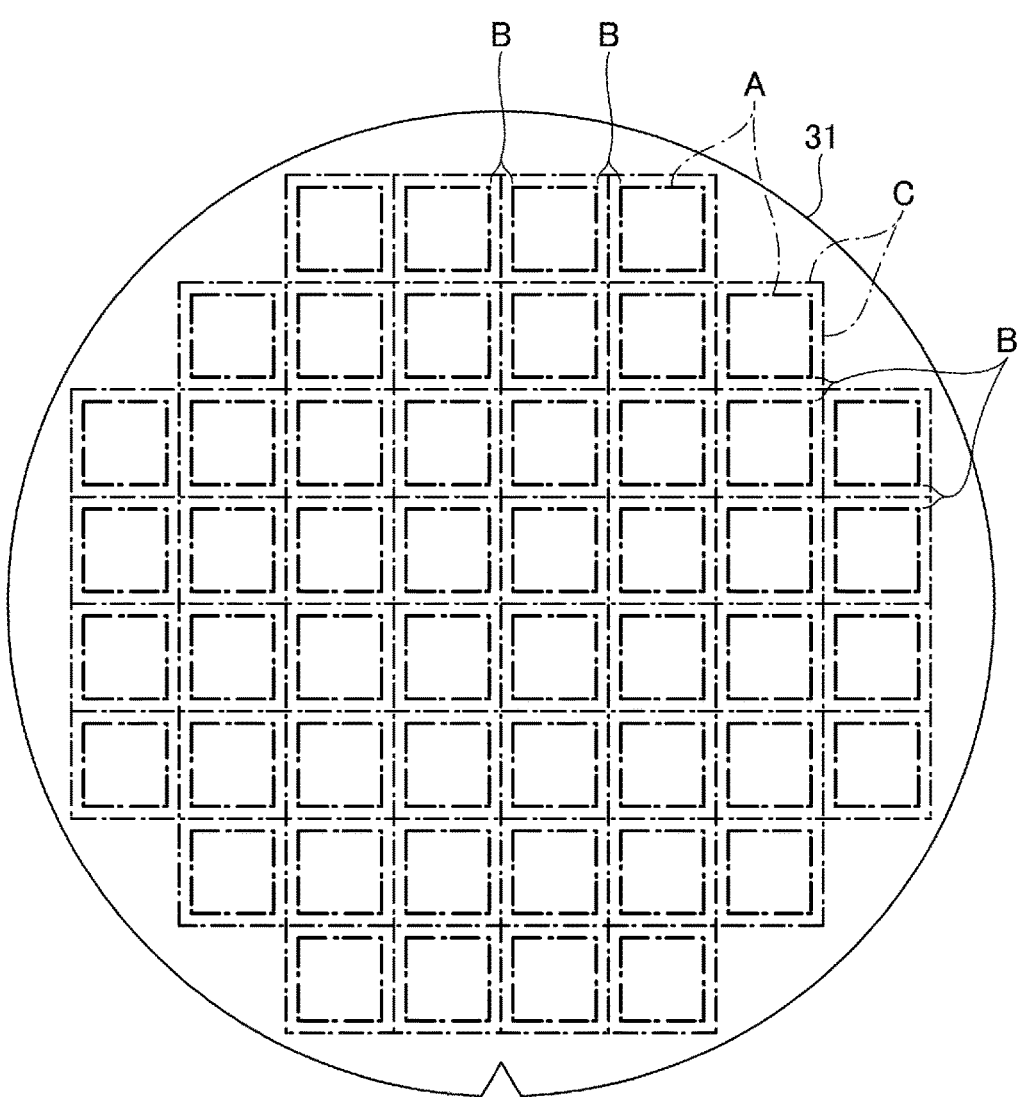
FIG. 7 is a fourth diagram illustrating the manufacturing process of the semiconductor device according to the first embodiment.

Next, in a process illustrated in FIG. 7, a non-thinned substrate 31 is prepared. As an example, the substrate 31 is a silicon wafer. The substrate 31 includes a plurality of product regions A and scribe regions B. The scribe regions B separate the product regions A from each other. The product regions A are arranged vertically and horizontally, for example. Further, "C" in the scribe regions B represents a position where a dicing blade or the like cuts the substrate 31 (hereinafter referred to as a "cutting position C").

Figure 8:
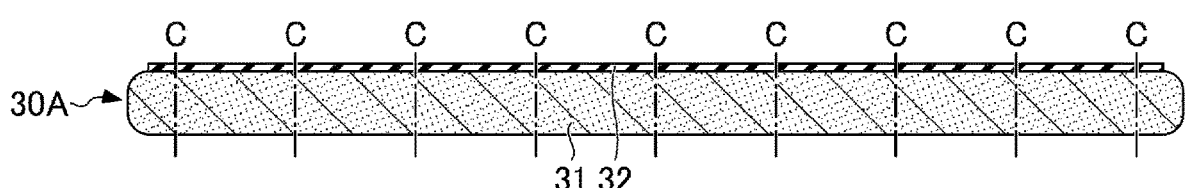
FIG. 8 is a fifth diagram illustrating the manufacturing process of the semiconductor device according to the first embodiment.

Next, in a process illustrated in FIG. 8, a semiconductor integrated circuit, an insulating layer 32, a wiring layer 33, and an electrode pad 34 are formed on the substrate 31 by a known method. Accordingly, a semiconductor device 30A including the plurality of product regions A to be separated is produced. Each of the separated product regions A serves as a semiconductor chip $30_1$. Note that the semiconductor integrated circuit, the wiring layer 33, and the electrode pad 34 are not depicted in FIG. 8.

Figure 9:
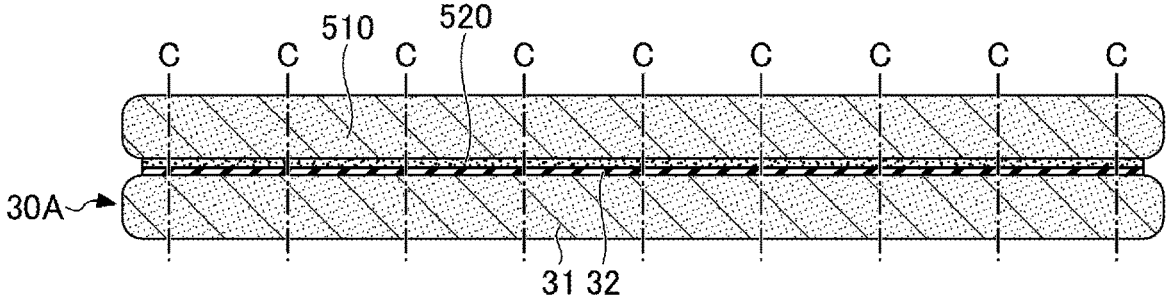
FIG. 9 is a sixth diagram illustrating the manufacturing process of the semiconductor device according to the first embodiment.

Next, in a process illustrated in FIG. 9, a support substrate 510 is joined to the side, on which electrode pads are formed, of the semiconductor device 30A via an adhesive layer 520. The support substrate 510 preferably allows light to pass therethrough during alignment, and for example, a substrate of quartz glass may be used as the substrate 510. For example, an adhesive that softens at a heating temperature (an adhesive that softens at approximately 200° C. or less) used in a process illustrated in FIG. 12, which will be described later, can be used as the adhesive layer 520. The adhesive layer 520 can be formed on one surface of the substrate 510 by, for example, a spin-coating method. Alternatively, the adhesive layer 520 may be formed on the element surface of the semiconductor device 30A. The adhesive layer 520 may be formed on one surface of the substrate 510 or on the element surface of the semiconductor device 30A by a method of attaching a film-like adhesive or the like instead of using a spin-coating method.

Figure 10:
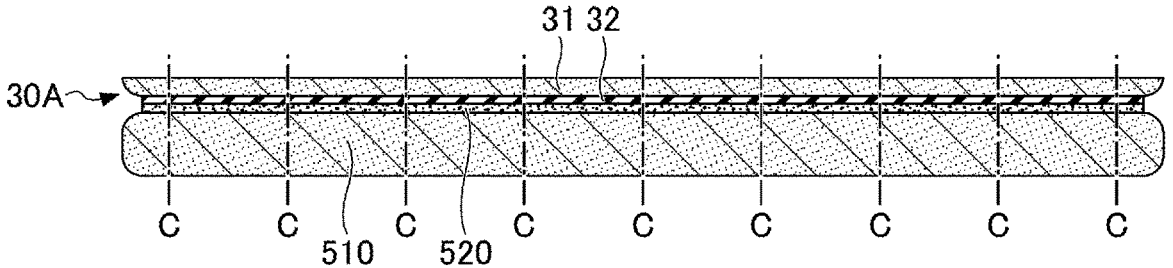
FIG. 10 is a seventh diagram illustrating the manufacturing process of the semiconductor device according to the first embodiment.

Next, in a process illustrated in FIG. 10, the top and the bottom of the structure illustrated in FIG. 9 are inverted. The back surface (surface on the opposite side from the main surface) of the substrate 31 of the semiconductor device 30A is mechanically ground with a grinder or the like and is polished by CMP or the like, such that the back surface of the substrate 31 is thinned. An insulating layer may be formed on the back surface of the thinned substrate 31 by a plasma CVD method or the like.

The thinned substrate 31 may have a thickness of, for example, 0.2 μm or more and 5 μm or less. By causing the substrate 31 to have a thickness of 0.2 μm or more and 5 μm or less, the processing time of via holes is greatly reduced, and the aspect ratio is reduced by thinning the substrate 31, thereby improving filling properties and coverage. Further, thermal conductivity from the substrate 31 to the power supply and ground layer 10 can also be improved.

Figure 11:
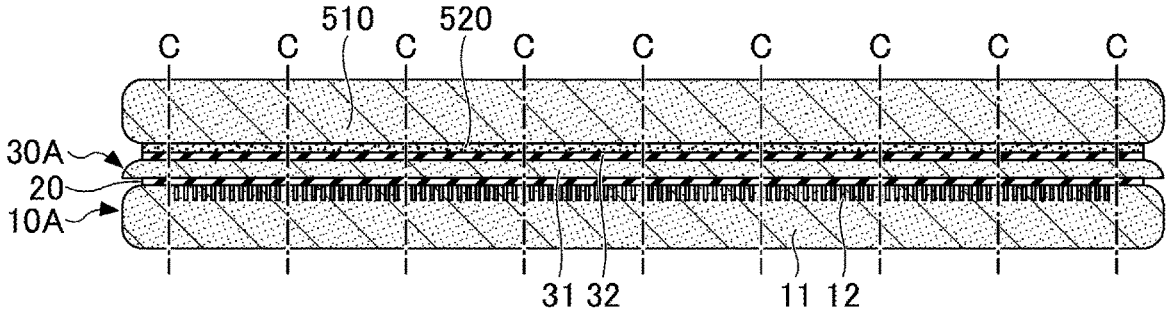
FIG. 11 is an eighth diagram illustrating the manufacturing process of the semiconductor device according to the first embodiment.

Next, in a process illustrated in FIG. 11, an insulating layer 20 is formed on the wiring part 12 side of the power supply and ground layer 10A, produced in FIG. 6, by a plasma CVD method or the like. Then, the back surface of the semiconductor device 30A, to which the support substrate 510 is joined, is directed towards the insulating layer 20, and the semiconductor device 30A is stacked on the power supply and ground layer 10A via the insulating layer 20.

Figure 12:
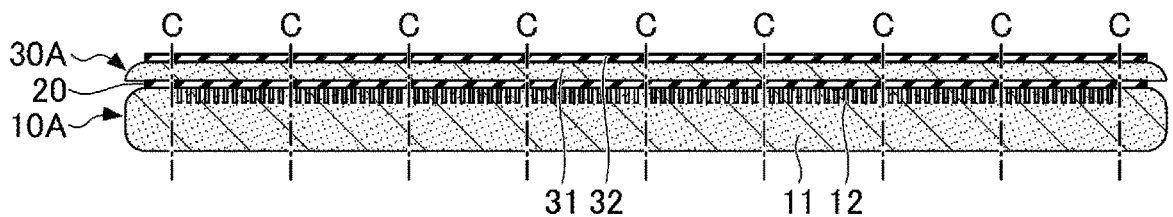
FIG. 12 is a ninth diagram illustrating the manufacturing process of the semiconductor device according to the first embodiment.

Next, in a process illustrated in FIG. 12, the support substrate 510 and the adhesive layer 520 illustrated in FIG. 11 are removed. As described above, an adhesive that softens at a heating temperature (an adhesive that softens at approximately 200° C. or less) used in the process illustrated in FIG. 12 is preferably used as the adhesive layer 520. As a result, a stack of the thinned semiconductor device 30A stacked on the power supply and ground layer 10A via the insulating layer 20 is formed.

In the following, FIG. 13 through FIG. 16 will be described with reference to a cross-section of one product region A (a region between adjacent cutting positions C) illustrated in FIG. 7.

Figure 13:
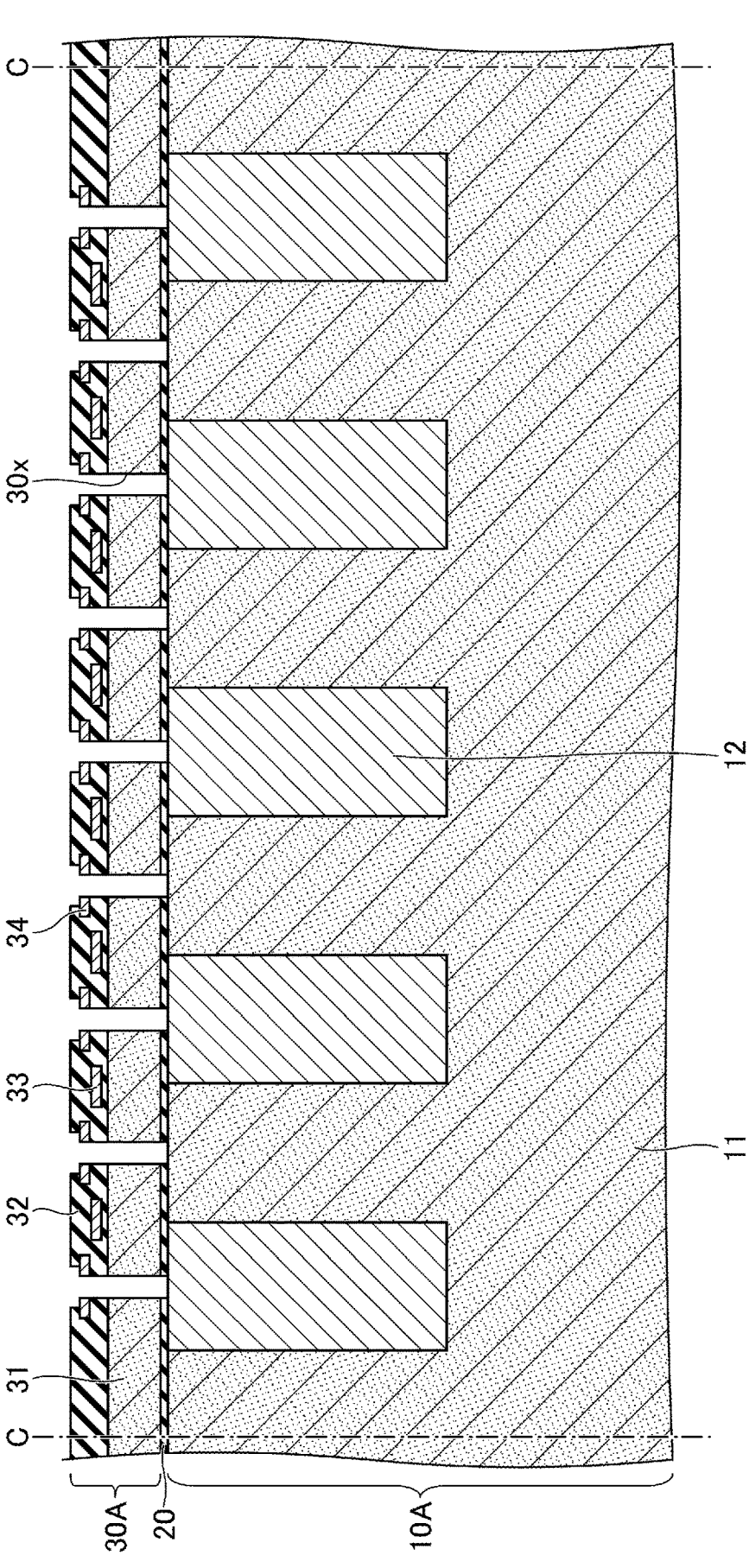
FIG. 13 is a tenth diagram illustrating the manufacturing process of the semiconductor device according to the first embodiment.

Next, in a process illustrated in FIG. 13, a via hole 30x is formed in the semiconductor device 30A. The via hole 30X penetrates through the electrode pad 34, the insulating layer 32, and the substrate 31 of the semiconductor device 30A, further penetrates through the insulating layer 20, and exposes the top surface of the substrate 11 or the top surface of the wiring part 12 of the power supply and ground layer 10A. The via hole 30X can be formed by, for example, dry etching. The via hole 30X may have, for example, a circular shape in a plan view, and the diameter of the via hole 30X may be, for example, approximately 0.3 μm to 5 μm.

Figure 14:
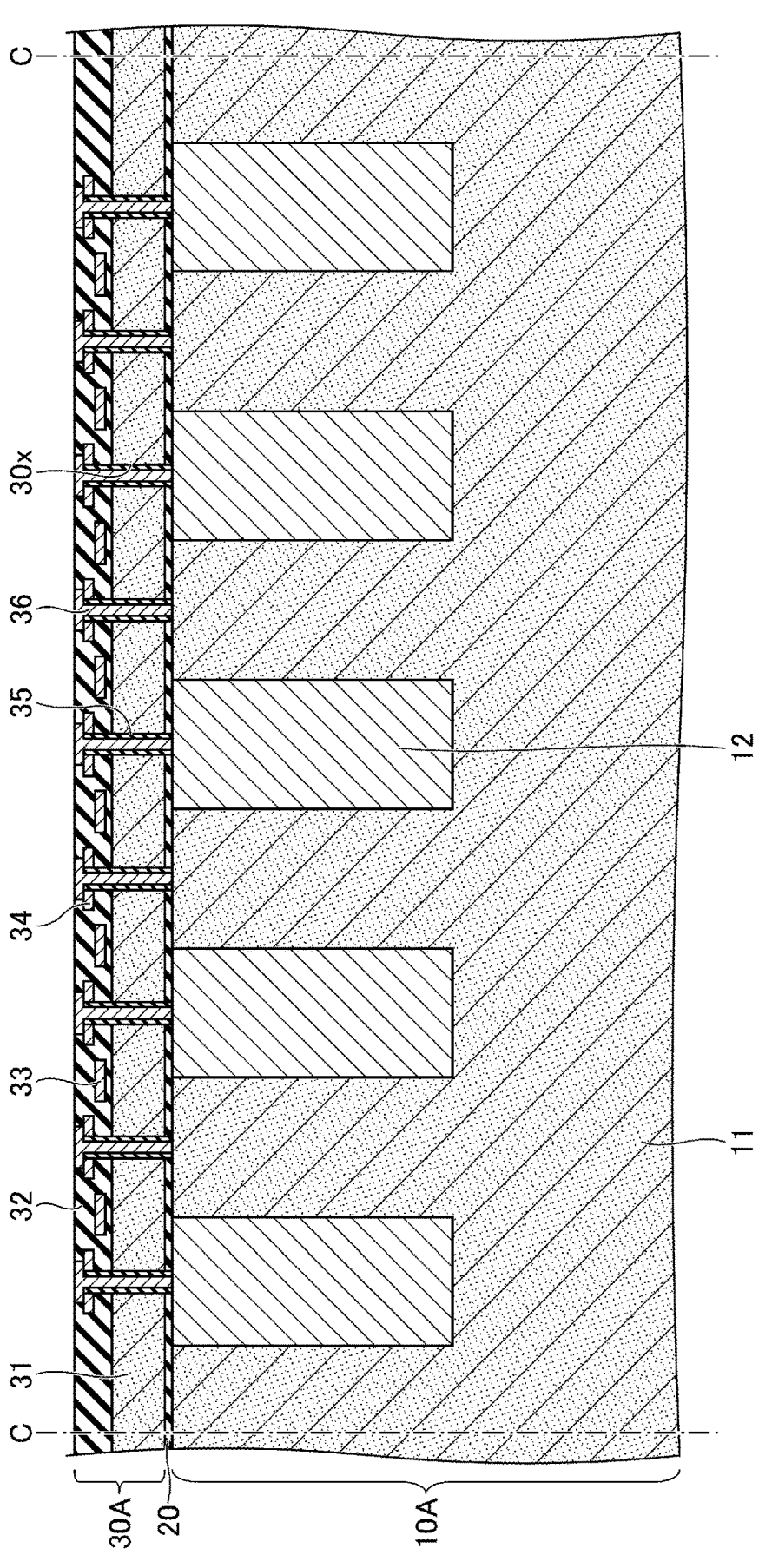
FIG. 14 is an eleventh diagram illustrating the manufacturing process of the semiconductor device according to the first embodiment.

Next, in a process illustrated in FIG. 14, an insulating layer 35 is formed so as to coat the inner wall surface of the via hole 30x. Further, a through-electrode 36 is formed on the inner surface of the insulating layer 35. The insulating layer 35 can be formed as follows. First, an insulating layer that continuously coats the inner wall surface of the via hole 30x and the top surface of the substrate 11 or the wiring part 12, exposed in the via hole 30x, is formed, by plasma CVD or the like. Then, the insulating layer is removed except for a portion that coats the inner wall surface of the via hole 30x by reactive ion etching (RIE) or the like.

The through-electrode 36 may be formed in the via hole 30x by a combination of a sputtering method and a plating method, for example. Specifically, for example, a power supply layer is formed by depositing metals such as Cu by a sputtering method in the range of approximately 50 nm to 500 nm, so as to continuously coat the inner wall surface of the via hole 30x and the top surface of the substrate 11 or the wiring part 12 exposed in the via hole 30x. Then, the via hole

30x is filled with a metal such as Cu by an electrolytic plating method allowing electrical power to be supplied through the power supply layer, such that an electrolytic plating layer protruding from the top surface of the insulating layer 32 is formed. Then, the electrolytic plating layer protruding from the top surface of the insulating layer 32 is removed by CMP or the like. The top surface of the electrolytic plating layer filling the via hole 30x may be, for example, coplanar with the top surface of the insulating layer 32. Accordingly, the through-electrode 36 in which the electrolytic plating layer is stacked on the power supply layer can be formed.

Figure 15:
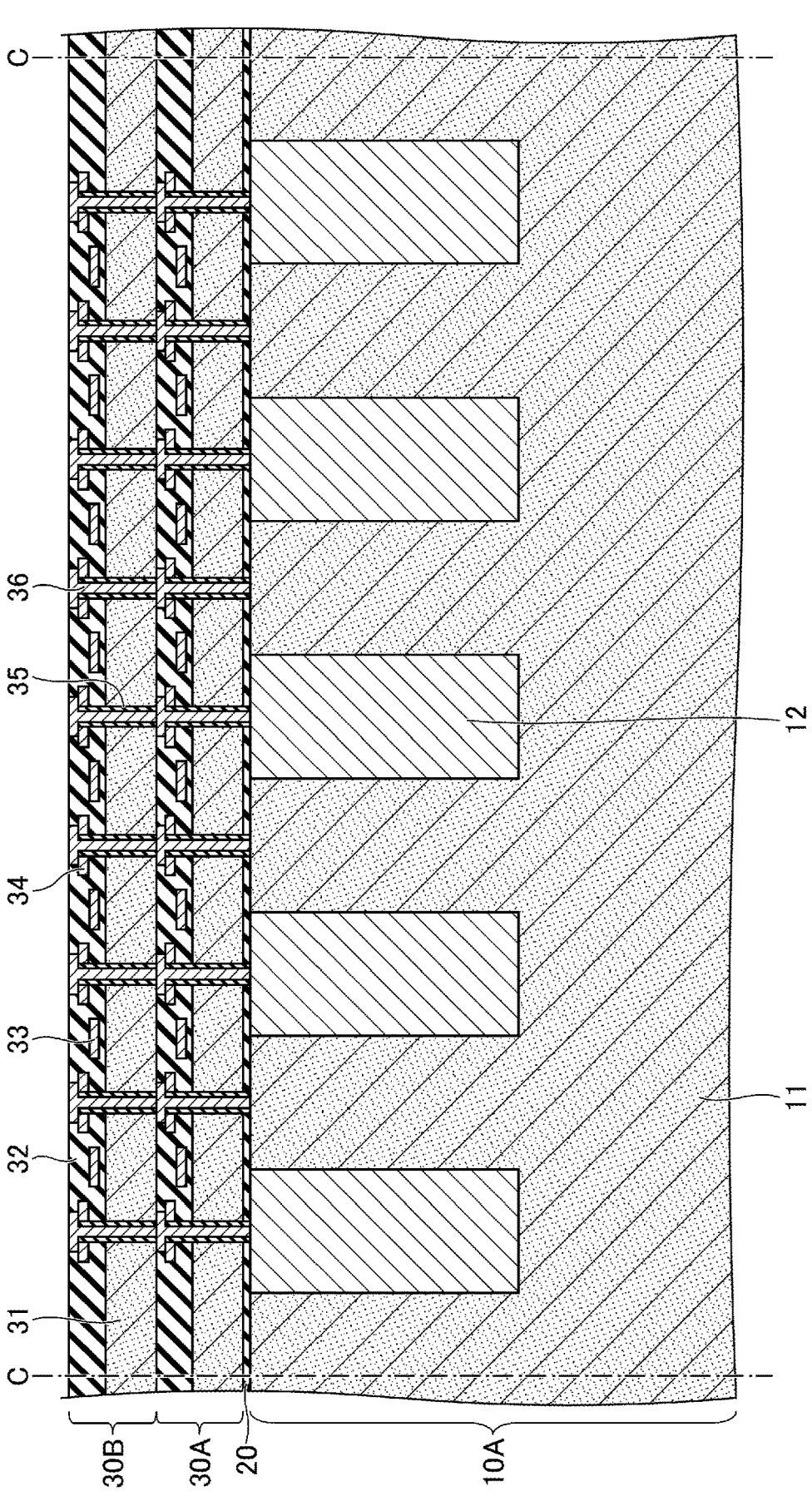
FIG. 15 is a twelfth diagram illustrating the manufacturing process of the semiconductor device according to the first embodiment.

Next, in a process illustrated in FIG. 15, a semiconductor device 30B having a plurality of product regions A is produced by performing the same processes as those illustrated in FIG. 7 and FIG. 8. The product regions A are to be separated and each of the separated product regions A serves as a semiconductor chip $30_2$. The structure of the semiconductor device 30B is the same as that of the semiconductor device 30A. Next, the semiconductor device 30B is stacked on the semiconductor device 30A by performing the same processes as those illustrated in FIG. 9 through FIG. 12. Then, a via hole 30X, an insulating layer 35, and a through-electrode 36 are formed in the semiconductor device 30B by performing the same processes as those illustrated in FIG. 13 and FIG. 14. An electrode pad 34 of the semiconductor device 30B is electrically connected to the through-electrode 36 of the semiconductor device 30A via the through-electrode 36 of the semiconductor device 30B.

Next, in a process illustrated in FIG. 16, the back surface of the substrate 11 of the power supply and ground layer 10A is mechanically ground with a grinder or the like and is polished by CMP or the like, such that the back surface of the substrate 11 is thinned. The thickness of the substrate 11 may be, for example, 200 μm.

Next, the structure illustrated in FIG. 16 is cut at the cutting positions C to separate each product region. Accordingly, a plurality of semiconductor chips $30_1$ are formed from the semiconductor device 30A, and a plurality of semiconductor chips $30_2$ are formed from the semiconductor device 30B. Further, a plurality of power supply and ground layers 10 including substrates 11 and wiring parts 12 are formed from the power supply and ground layer 10A. That is, a plurality of semiconductor devices 1 (see FIG. 1) are produced. In each of the semiconductor devices 1, a semiconductor chip $30_1$ and a semiconductor chip $30_2$ are sequentially stacked on a power supply and ground layer 10 via an insulating layer 20.

As described, a semiconductor device 1 includes a power supply and ground layer 10 and a semiconductor chip $30_1$. The power supply and ground layer 10 includes a substrate 11 and a wiring part 12. The substrate 11 has grooves 115 whose openings are directed toward the semiconductor chip $30_1$, and the wiring part 12 is disposed within the grooves 115 via an insulating layer and is formed in a predetermined pattern. The wiring part 12 is not exposed from the back surface of the substrate 11. The substrate 11 is connected to ground wiring of the semiconductor chip $30_1$, and the wiring part 12 is connected to power supply wiring of the semiconductor chip $30_1$.

In the semiconductor device 1, a metal such as copper, which is a highly electrically conductive material, is used as the material of the wiring part 12. Therefore, the power supply can be stabilized, and by stabilizing the power supply, the voltage can be reduced (that is, power consumption can be reduced). Further, because a metal such as copper is also a highly thermally conductive material, heat dissipation of the entire semiconductor device 1 can be made uniform. Further, the back surface of the semiconductor device 1 includes the substrate 11 only, and the wiring part 12 is not exposed from the back surface of the substrate 11. Therefore, heat can be efficiently dissipated from the back surface of the substrate 11, thus improving the heat dissipation performance of the semiconductor device 1. That is, the semiconductor device 1 that stabilizes the power supply and improves heat dissipation performance can be provided.

Further, the back surface of the semiconductor device 1 includes the substrate 11 only, and the wiring part 12 is not exposed from the back surface of the substrate 11. Therefore, a heat sink or the like made of a metal can be readily attached to the back surface of the substrate 11.

In FIG. 2 and the like, an example in which the wiring part 12 as a whole is formed within the grooves 115 of the substrate 11 is depicted; however, the present invention is not limited thereto. For example, the wiring part 12 may be divided into wiring parts of a plurality of systems, which are insulated from each other, in a plan view (see FIG. 26 and the like, as will be described later, for example). In this case, the wiring parts of the respective systems can be connected to power supply wiring of different systems (e.g., power supply wiring having different power supply voltages) of a semiconductor chip.

First Modification of First Embodiment

A first modification of the first embodiment illustrates an example of a semiconductor device that includes a power supply and ground layer in which the structure of a wiring part differs from that of the first embodiment. In the first modification of the first embodiment, the description of the same components as those of the first embodiment described above may be omitted.

Figure 17:
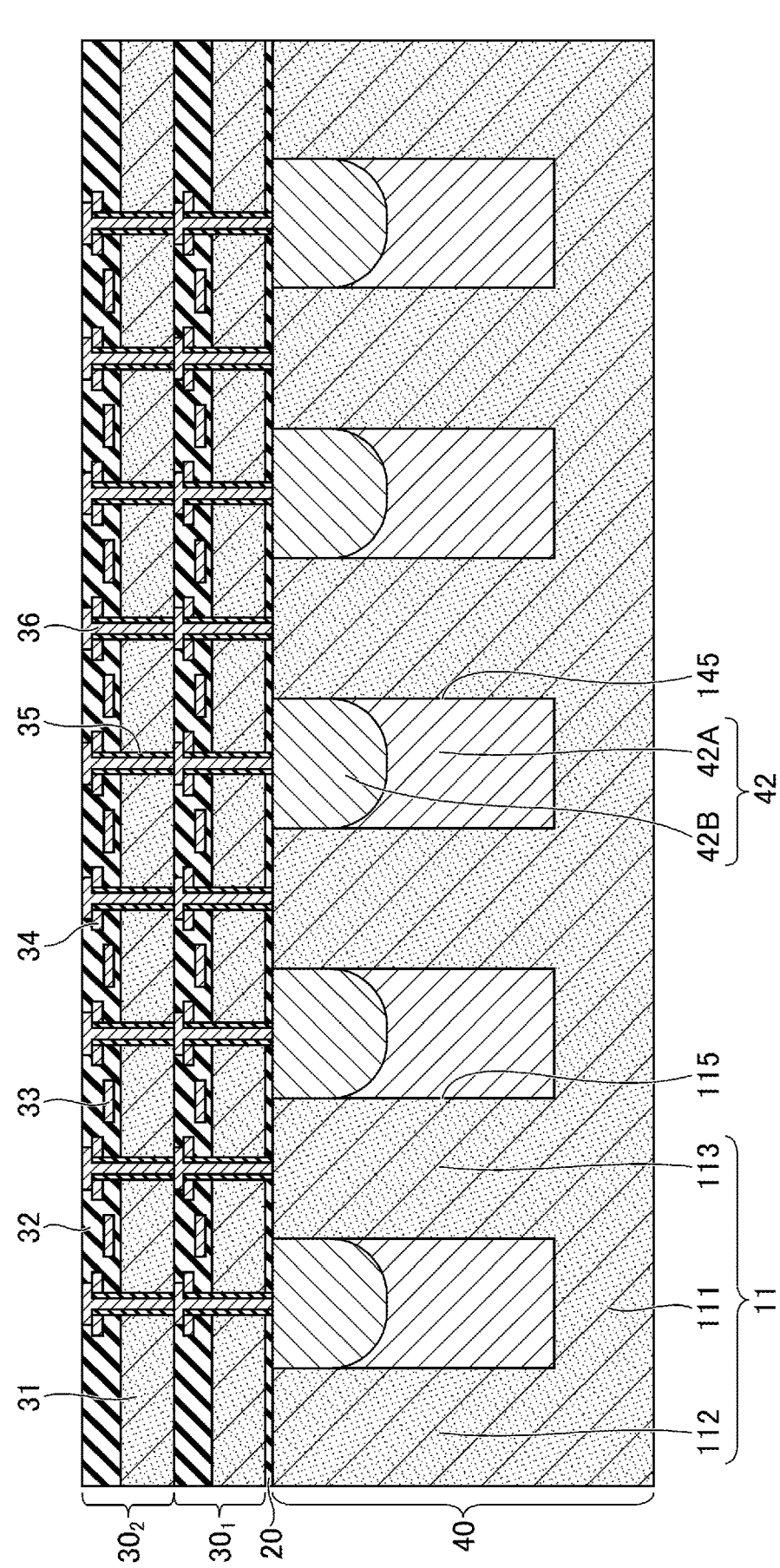
FIG. 17 is a cross-sectional view of a semiconductor device according to a first modification of the first embodiment.

FIG. 17 is a cross-sectional view of a semiconductor device according to the first modification of the first embodiment. Referring to FIG. 17; a semiconductor device 1A according to the first modification of the first embodiment differs from the semiconductor device 1 (see FIG. 1, and the like) in that the power supply and ground layer 10 is replaced with a power supply and ground layer 40.

The power supply and ground layer 40 includes the substrate 11 and a wiring part 42. The substrate 11 is as described above. The wiring part 42 is disposed in the grooves 115 of the substrate 11 via an insulating layer or a barrier layer (not illustrated). The wiring part 42 having openings 145 can be formed in the same pattern as that illustrated in FIG. 2. The size relationship between the substrate 11 and the wiring part 42 can be the same as the size relationship between the substrate 11 and the wiring part 12.

The wiring part 42 has a stacked structure in which a second layer 42B is stacked on a first layer 42A. The first layer 42A is formed of a material that is more thermally conductive than the second layer 42B. The first layer 42A is, for example, a carbon layer that includes carbon nanotubes or graphene pieces. The second layer 42B is, for example, a metal layer such as a copper layer. In other words, the wiring part 42 includes a metal layer located closer to the semiconductor chip 30₁ and a carbon layer located under the metal layer.

For example, in a case where the first layer 42A is a carbon layer and the second layer 42B is a copper layer, the heat dissipation performance of the wiring part 42 can be increased as compared to when the wiring part 42 is composed only of a copper layer. This is because a carbon layer can more readily conduct heat than a copper layer. However, in order to reduce the resistance and the contact resistance of the wiring part 42, the wiring part 42 needs to include a carbon layer as well, rather than being composed only of a copper layer. That is, the wiring part 42 including both a carbon layer and a copper layer allows thermal resistance and electrical resistance to be reduced. In addition, thermal strain in copper can be reduced by providing a carbon layer.

In order to sufficiently improve heat dissipation performance, the area of the first layer 42A (the carbon layer, for example) is preferably 10% or more of the area of the wiring part 42 (the total area of the carbon layer and the metal layer, for example) in a vertical-sectional view as illustrated in FIG. 17.

Figure 18:
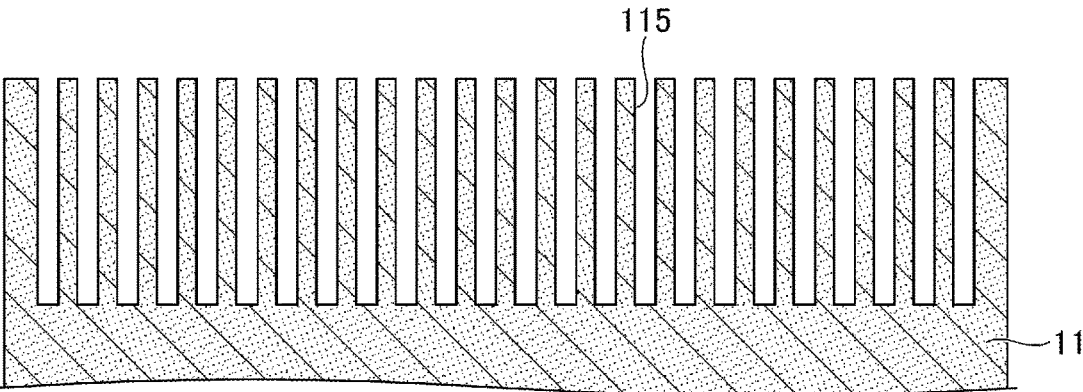
FIG. 18 is a first diagram illustrating a manufacturing process of the semiconductor device according to the first modification of the first embodiment.
Figure 19:
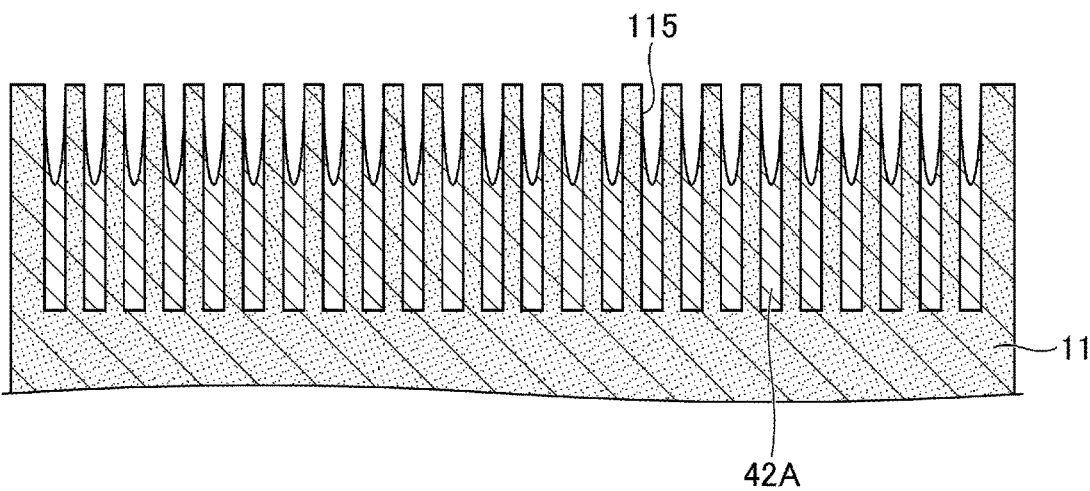
FIG. 19 is a second diagram illustrating the manufacturing process of the semiconductor device according to the first modification of the first embodiment.

For example, the power supply and ground layer 40 is formed by producing a substrate 11 having grooves 115 as illustrated in FIG. 18 in the same manner as described in FIG. 4 and FIG. 5, and forming a first layer 42A in the grooves 115 of the substrate 11 as illustrated in FIG. 19. Specifically, first, an insulating layer that coats the bottom surfaces and the inner wall surfaces of the grooves 115 is formed. Next, a barrier metal layer and a seed layer are sequentially formed so as to coat the insulating layer. Then, a solution containing carbon nanotubes, graphene pieces, or the like is poured into the grooves 115, and any solution adhering to the outside of the grooves 115 is wiped off, and the solvent is dried. As a result, the first layer 42A is formed.

Figure 20:
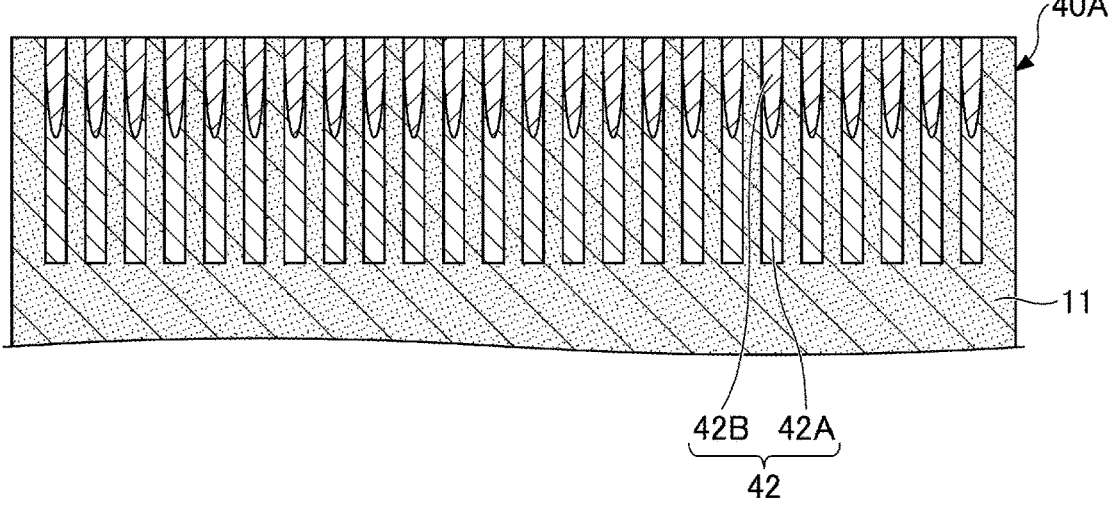
FIG. 20 is a third diagram illustrating the manufacturing process of the semiconductor device according to the first modification of the first embodiment.

Next, as illustrated in FIG. 20, a second layer 42B is formed on the first layer 42A within the grooves 115. Specifically, an electrolytic plating layer made of copper or the like is formed on the seed layer, which is formed in FIG. 19, by an electrolytic plating method allowing electrical power to be supplied from the seed layer, such that the electrolytic plating layer protrudes from the top surface of the substrate 11. Then, the electrolytic plating layer protruding from the top surface of the substrate 11 is removed by CMP or the like. The top surface of the substrate 11 may be, for example, coplanar with the top surface of the second layer 42B. Subsequently, annealing and sintering are preferably carried out under appropriate conditions. Accordingly, a power supply and ground layer 40A that includes the wiring part 42 is produced. The wiring part 42 is formed within the grooves 115 of the substrate 11, and includes the first layer 42A and the second layer 42B that are sequentially stacked. The power supply and ground layer 40A has a plurality of regions to be separated, and the separated regions each serve as a power supply and ground layer 40.

Note that, in the process illustrated in FIG. 19, metal nanopaste may be mixed with the solution containing carbon nanotubes or graphene pieces. Examples of the metal nanopaste include copper nanopaste. When sintering is performed in the process illustrated in FIG. 20, for example, copper particles in the copper nanopaste are sintered with copper in the seed layer. Thus, the contact resistance with the carbon material can be improved.

Further, metal nanopaste may be used to form the second layer 42B in the process illustrated in FIG. 20. Examples of the metal nanopaste include copper nanopaste. The second layer 42B formed of metal nanopaste becomes porous, thus facilitating the reduction in thermal strain in a metal such as copper. If the surface flatness is not achieved by sintering, plating or CMP may be added for the purpose of complementation.

Second Modification of First Embodiment

A second modification of the first embodiment illustrates an example of a semiconductor device in which a connection wiring part is disposed between the power supply and ground layer and the semiconductor chip. In the second modification of the first embodiment, the description of the same components as those of the first embodiment described above may be omitted.

Figure 21:
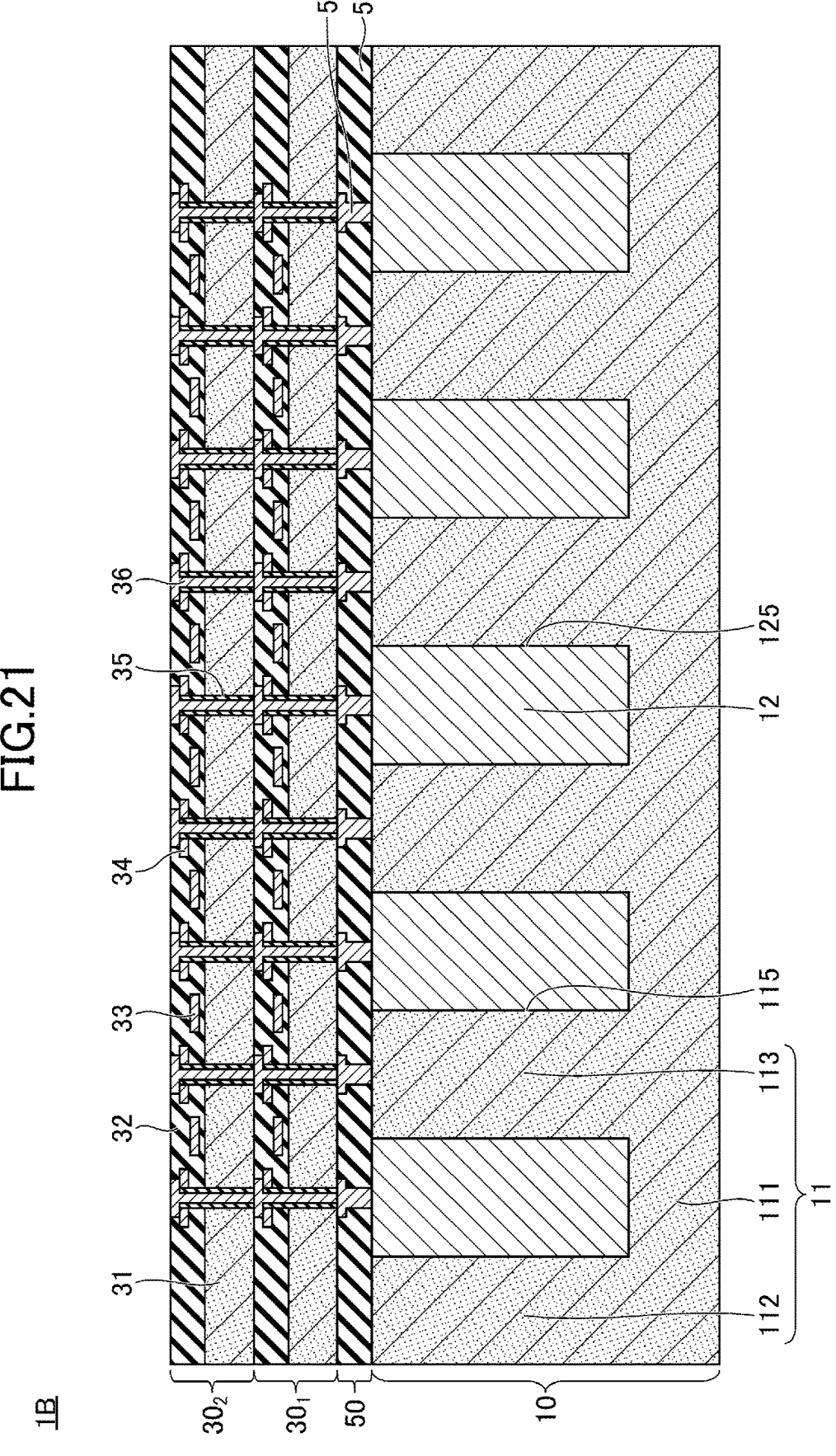
FIG. 21 is a cross-sectional view of a semiconductor device according to a second modification of the first embodiment.

FIG. 21 is a cross-sectional view of a semiconductor device according to the second modification of the first embodiment. Referring to FIG. 21, a semiconductor device 1B according to the second modification of the first embodiment differs from the semiconductor device 1 (see FIG. 1 and the like) in that a connection wiring part 50 is disposed between the power supply and ground layer 10 and the semiconductor chip 30₁.

The connection wiring part 50 includes an insulating layer 51 and wiring layer 52. The insulating layer 51 may be formed of, for example, a silicon oxide, and the wiring layer 52 may be formed of, for example, copper. The wiring layer 52 includes wiring formed on the top surface side of the insulating layer 51, and through-wiring connected to the wiring and passing through the insulating layer 51. The wiring layer 52 may be formed by, for example, a dual damascene method. A part of the through-wiring of the wiring layer 52 is electrically connected to the substrate 11 of the power supply and ground layer 10, and the other part of the through-wiring is electrically connected to the wiring part 12 of the power supply and ground layer 10.

The wiring layer 52 illustrated in FIG. 21 is simplified; however, the wiring layer 52 includes higher density wiring than wiring of the wiring part 12. If the line width of the wiring part 12 is approximately 20 μm, the minimum line width of the wiring layer 52 can be approximately one fortieth of the line width of the wiring part 12. In this manner, even if it may be difficult to directly connect the semiconductor chip 30₁ to the power supply and ground layer 10, the semiconductor chip 30₁ can be readily connected to the power supply and ground layer 10 via the connection wiring part 50. Note that the connection wiring part 50 may have a multilayer wiring structure.

Comparison with Conventional Structures the copper wiring are as indicated in Table 1. That is, as compared to the semiconductor devices according to first and second examples, the thickness of the copper wiring in each of the semiconductor devices according to the first and second conventional structures is significantly small, and there is no bottom portion corresponding to a bottom portion 111 of the semiconductor device according to the first example or the second example. Note that the "insulating layer" indicated in Table 1 is an insulating layer formed between a silicon substrate and wiring.

The semiconductor device according to the first example has a structure as illustrated in FIG. 1 and the like. In the first example, silicon is used as the material of a substrate 11, the thickness of the substrate 11 is 200 μm, and the thickness of a bottom portion 111 is 20 μm. Further, a wiring part 12 includes a copper layer only. The line width and the line spacing of the wiring part 12 are both 20 μm, and the thickness of the wiring part 12 is 180 μm. The thickness of an insulating layer is 0.2 μm. The volume of silicon is 60% or less of the total volume of the silicon and the wiring part. The total area of the end faces of through-electrodes connected to the silicon or the wiring part is 2% or more of the area of the back surface of a semiconductor chip.

The semiconductor device according to the second example has a structure as illustrated in FIG. 17 and the like. In the second example, silicon is used as the material of a substrate 11, the thickness of the substrate 11 is 200 μm, and the thickness of a bottom portion 111 is 20 μm. Further, a wiring part 12 includes a copper layer and a carbon layer. The line width and the line spacing of the wiring part 12 are both 20 μm, and the thickness of the wiring part 12 is 180 μm. The thickness of an insulating layer is 0.2 μm. The volume of silicon is 60% or less of the total volume of the silicon and the wiring part. The total area of the end faces of through-electrodes connected to the silicon or the wiring part is 2% or more of the area of the back surface of a semiconductor chip. The area of the carbon layer is 10% or more of the total area of the carbon layer and the copper layer in a vertical-sectional view as illustrated in FIG. 17.

TABLE 1

| | LINE WIDTH (μm) | LINE SPACE (μm) | THICKNESS (μm) | THICKNESS OF INSULATING LAYER (μm) | THICKNESS OF BOTTOM PORTION (μm) |
|---|---|---|---|---|---|
| FIRST CONVENTIONAL STRUCTURE | 0.25 | 0.25 | 0.25 | 0.25 | 0 |
| SECOND CONVENTIONAL STRUCTURE | 15 | 10 | 10 | 0.2 | 0 |
| FIRST EXAMPLE | 20 | 20 | 180 | 0.2 | 20 |
| SECOND EXAMPLE | 20 | 20 | 180 | 0.2 | 20 |

Table 1 indicates the specifications of semiconductor devices according to first and second conventional structures and semiconductor devices according to first and second examples. The power consumption and in-plane temperature differences of the semiconductor devices are compared and studied. Note that the second conventional structure is a structure described in Non-Patent Document 1.

In each of the semiconductor devices according to the first and second conventional structures, a silicon substrate is processed from the back surface side, copper wiring is formed on the back surface side of the silicon substrate, and the bottom surface of the copper wiring is exposed from the back surface of the silicon substrate. The specifications of

TABLE 2

| | POWER CONSUMPTION RATIO | IN-PLANE TEMPERATURE DIFFERENCE |
|---|---|---|
| FIRST CONVENTIONAL STRUCTURE | 100% | 20.0° C. |
| SECOND CONVENTIONAL STRUCTURE | 92% | 18.9° C. |
| FIRST EXAMPLE | 88% | 10.3° C. |
| SECOND EXAMPLE | 88% | 5.6° C. |

Table 2 indicates the comparison results. With respect to the power consumption ratio indicated in Table 2, the power consumption of each semiconductor device operating at 600 mV is compared to the power consumption of the semiconductor device according to the first conventional structure, which is assumed to be 100%. It can be seen that the power consumption of the semiconductor devices according to the first and second examples, in which the wiring parts have increased thicknesses, can be reduced as compared to that according to the first and second conventional structures.

Further, with respect to in-plane temperature differences indicated in Table 2, in-plane temperature differences of the semiconductor devices according to the second conventional structure and the first and second examples are calculated when the semiconductor device according to the first conventional structure has an in-plane temperature difference of 20° C. The in-plane temperature difference of the semiconductor device according to the first example can be reduced to approximately half that of the semiconductor device according to the first conventional structure. That is, the in-plane temperature difference can be significantly reduced by the effects of the thick copper wiring and the bottom part formed in the silicon substrate. The in-plane temperature difference of the semiconductor device according to the second example, in which the wiring part includes the copper layer and the carbon layer, can be further reduced to approximately half that of the semiconductor device according to the first example. In other words, the effect of the carbon layer included in the wiring part is highly significant. Note that if the in-plane temperature difference is approximately 10° C. and a semiconductor device is a dynamic random-access memory (DRAM), the reference time of the data retention time of the DRAM can be maintained, and thus, there is no need to take special measures such as changing the refresh period.

Application Example of First Embodiment

An application example of the first embodiment illustrates an example of a semiconductor device in which a plurality of stacks are thermally coupled to each other. In each of the stacks, a power supply and ground layer and a semiconductor chip are stacked. In the application example of the first embodiment, the description of the same components as those of the first embodiment described above may be omitted.

Figure 22:
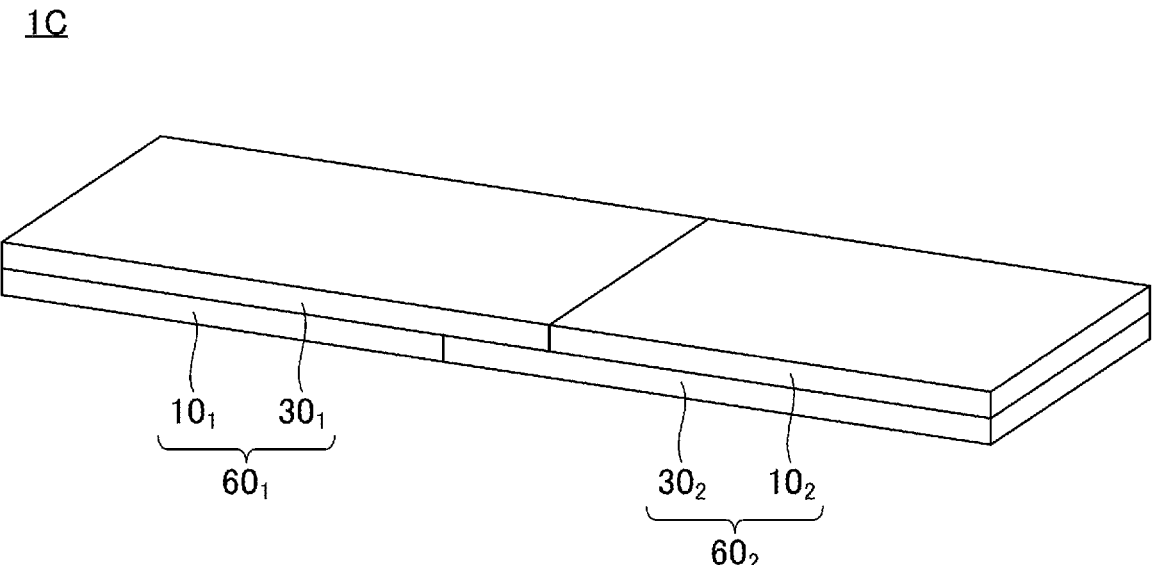
FIG. 22 is a perspective view of a semiconductor device according to a first application example of the first embodiment.

FIG. 22 is a perspective view of a semiconductor device according to a first application example of the first embodiment. Referring to FIG. 22, a semiconductor device 1C according to the first application example of the first embodiment includes a stack $60_1$ and a stack $60_2$. In the stack $60_1$, a semiconductor chip $30_1$ is stacked on a power supply and ground layer $10_1$, and in the stack $60_2$, a power supply and ground layer $10_2$ is stacked on a semiconductor chip $30_2$.

In the stack $60_1$, the semiconductor chip $30_1$ is larger than the power supply and ground layer $10_1$, and a portion of the semiconductor chip $30_1$ extends beyond the end portion of the power supply and ground layer $10_1$ in a plan view. In the stack $60_2$, the semiconductor chip $30_2$ is larger than the power supply and ground layer $10_2$, and a portion of the semiconductor chip $30_2$ extends beyond the end portion of the power supply and ground layer $10_2$ in a plan view.

The stack $60_1$ and the stack $60_2$ are arranged such that the power supply and ground layer $10_1$ and the power supply and ground layer $10_2$ are disposed opposite to each other and the extended portion of the semiconductor chip $30_1$ contacts the extended portion of the semiconductor chip $30_2$. In a region where the extended portion of the semiconductor chip $30_1$ contacts the extended portion of the semiconductor chip $30_2$, the semiconductor chip $30_1$ is electrically connected to the semiconductor chip $30_2$. The semiconductor chip $30_1$ and the semiconductor chip $30_2$ may be connected face-to-face or face-to-back.

The semiconductor chip $30_1$ of the stack $60_1$ may be, for example, a logic chip having a relatively low power supply voltage. The semiconductor chip $30_2$ of the stack $60_2$ may be, for example, a static RAM (SRAM) chip having a relatively high power supply voltage.

In the semiconductor device 1C, the area of non-overlapping portions of the semiconductor chip $30_1$ and the semiconductor chip $30_2$ is larger than the area of overlapping portions of the semiconductor chip $30_1$ and the semiconductor chip $30_2$. The power supply and ground layers are disposed on the non-overlapping portions of the semiconductor chip $30_1$ and the semiconductor chip $30_2$. Therefore, it is possible to suppress the occurrence of hot spots in the semiconductor device 1C, thus allowing the heat dissipation of the entire semiconductor device 1C to be made uniform. In addition, because the areas of the power supply and ground layers are increased, shortages of heat dissipation areas are resolved. Therefore, heat can be efficiently dissipated from each of the power supply and ground layers.

Figures 23A, 23B:
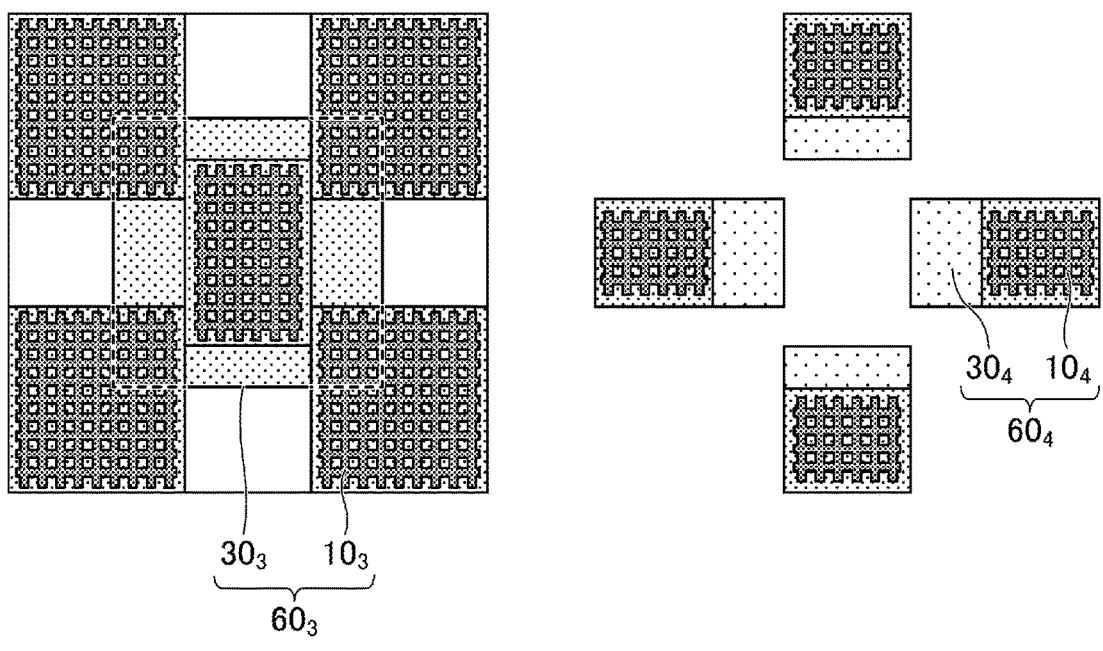
FIG. 23A through FIG. 23C are plan views of a semiconductor device according to a second application example of the first embodiment.
Figure 23C:
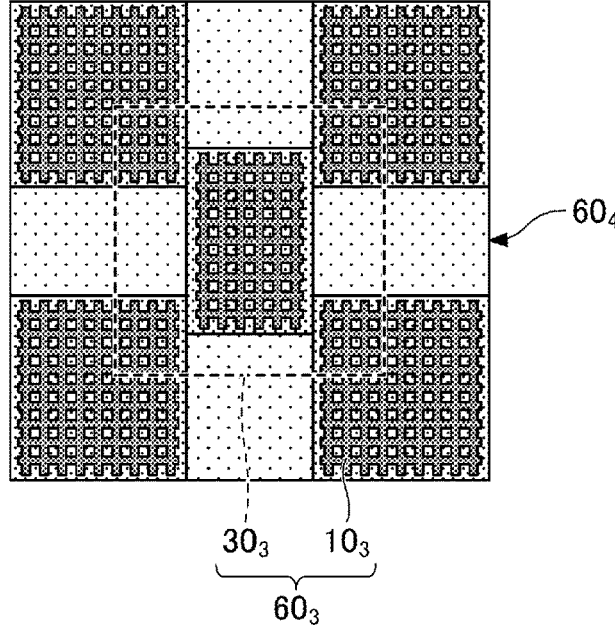

FIG. 23A through FIG. 23C are plan views of a semiconductor device according to a second application example of the first embodiment. Referring to FIG. 23A through FIG. 23C, a semiconductor device 1D according to the second application example of the first embodiment includes one stack $60_3$ and four stacks $60_4$. In the stack $60_3$, five power supply and ground layers $10_3$ and a semiconductor chip $30_3$ are stacked, and in each of the stacks $60_4$, a power supply and ground layer $10_4$ and a semiconductor chip $30_4$ are stacked.

As illustrated in FIG. 23A, the stack $60_3$ includes the five power supply and ground layers $10_3$. One of the five power supply and ground layers $10_3$ is stacked at the center of one surface of the semiconductor chip $30_3$, and the outer periphery of the one surface of the semiconductor chip $30_3$ is exposed from the periphery of the one power supply and ground layer $10_3$. The four power supply and ground layers $10_3$ are disposed at the respective corner portions of the one surface of the semiconductor chip $30_3$, which is exposed from the outer periphery of the one power supply and ground layer $10_3$ disposed at the center, such that the four power supply and ground layers $10_3$ extend outward beyond the corner portions of the semiconductor chip $30_3$.

As illustrated in FIG. 23B, in each of the stacks $60_4$, the semiconductor chip $30_4$ is larger than the power supply and ground layer $10_4$, and a portion of the semiconductor chip $30_4$ extends beyond the end portion of the power supply and ground layer $10_4$. The four stacks $60_4$ are prepared.

The four stacks $60_4$ are disposed as illustrated in FIG. 23B, and the top and bottom of each of the stacks $60_4$ are inverted. Then, the four stacks $60_4$ are stacked on the stack $60_3$, and as a result; a semiconductor device 1D is obtained as illustrated in FIG. 23C. In the semiconductor device 1D, portions of the one surface of the semiconductor chip $30_3$, exposed from the power supply and ground layers $10_3$, contact the extended portions of the semiconductor chips $30_4$ of the stacks $60_4$. In regions where the exposed portions of the semiconductor chip $30_3$ contact the extended portions of the semiconductor chips $30_4$, the semiconductor chip $30_3$ is electrically connected to the semiconductor chips $30_4$. The semiconductor chip $30_3$ and the semiconductor chips $30_4$ may be connected face-to-face or face-to-back.

The semiconductor chip $30_3$ of the stack $60_3$ may be, for example, a microprocessor (MPU) chip or a graphics processing unit (GPU) chip. Further, the semiconductor chips $30_4$ of the stacks $60_4$ are, for example, SRAM chips. That is, an MPU chip or a GPU chip is disposed at the center of the semiconductor device 1D, and four SRAM chips are disposed around the MPU chip or the GPU chip. Alternatively, a SRAM chip may be disposed at the center of the semiconductor device 1D, and various processor chips may be disposed around the SRAM chip.

Similar to the semiconductor device 1C, in the semiconductor device 1D, the area of non-overlapping portions of the semiconductor chip $30_3$ and the semiconductor chips $30_4$ is larger than the area of overlapping portions of the semiconductor chip $30_3$ and the semiconductor chips $30_4$. The power supply and ground layers are disposed on the non-overlapping portions of the semiconductor chip $30_3$ and the semiconductor chips $30_4$. Therefore, it is possible to suppress the occurrence of hot spots in the semiconductor device 1D, thus allowing the heat dissipation of the entire semiconductor device 1D to be made uniform. In addition, because the area of each of the power supply and ground layers is increased, shortages of heat dissipation areas can be resolved. Therefore, heat can be efficiently dissipated from each of the power supply and ground layers.

FIG. 24A through FIG. 24C are plan views of a semiconductor device according to a third application example of the first embodiment. Referring to FIG. 24A through FIG. 24C, a semiconductor device 1E according to the third application example of the first embodiment includes one stack $60_5$ and two stacks $60_6$. In the stack $60_5$, a power supply and ground layer $10_5$ and a semiconductor chip $30_5$ are stacked, and in each of the stacks $60_6$, a power supply and ground layer $10_6$ and a semiconductor chip $30_6$ are stacked.

As illustrated in FIG. 24A, in the stack $60_5$, the power supply and ground layer $10_5$ is stacked at the center of one surface of the semiconductor chip $30_5$. Both end portions of the one surface of the semiconductor chip $30_5$ are exposed from the respective sides of the power supply and ground layer $10_5$.

As illustrated in FIG. 24B, in each of the stacks $60_6$, the semiconductor chip $30_6$ is larger than the power supply and ground layer $10_6$, and a portion of the semiconductor chip $30_6$ extends beyond the end portion of the power supply and ground layer $10_6$. The two stacks $60_6$ are prepared.

The two stacks $60_6$ are disposed as illustrated in FIG. 24B, and the top and bottom of each of the stacks $60_6$ are inverted. Then, the two stacks $60_6$ are stacked on the stack $60_5$, and as a result, a semiconductor device 1E is obtained as illustrated in FIG. 24C. In the semiconductor device 1E, the portions of the one surface of the semiconductor chip $30_5$, which is exposed from the power supply and ground layer $10_5$, contact the extended portions of the semiconductor chips $30_6$ of the stacks $60_6$. In regions where the exposed portions of the semiconductor chip $30_5$ contact the extended portions of the semiconductor chips $30_6$, the semiconductor chip $30_5$ is electrically connected to the semiconductor chips $30_6$. The semiconductor chip $30_5$ and the semiconductor chips $30_6$ may be connected face-to-face or face-to-back.

The semiconductor chip $30_5$ of the stack $60_3$ may be, for example, an MPU chip or a GPU chip. Further, the semiconductor chips $30_6$ of the stacks $60_6$ are, for example, SRAM chips. That is, an MPU chip or a GPU chip is disposed at the center of the semiconductor device 1E, and two SRAM chips are disposed on both sides of the MPU chip or the GPU chip. Alternatively, a SRAM chip may be disposed at the center of the semiconductor device 1E, and various processor chips may be disposed on both sides of the SRAM chip.

Similar to the semiconductor device 1C, in the semiconductor device 1E, the area of non-overlapping portions of the semiconductor chip $30_5$ and the semiconductor chips $30_6$ is larger than the area of overlapping portions of the semiconductor chip $30_5$ and the semiconductor chips $30_6$. The power supply and ground layers are disposed on the non-overlapping portions of the semiconductor chip $30_5$ and the semiconductor chips $30_6$. Therefore, it is possible to suppress the occurrence of hot spots in the semiconductor device 1E, thus allowing the heat dissipation of the entire semiconductor device 1E to be made uniform. In addition, because the area of each of the power supply and ground layers is increased, shortages of heat dissipation areas can be resolved. Therefore, heat can be efficiently dissipated from each of the power supply and ground layers.

Figure 25A:
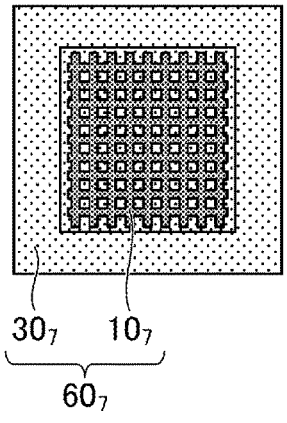
FIG. 25A through FIG. 25C are plan views of a semiconductor device according to a fourth application example of the first embodiment.
Figure 25B:
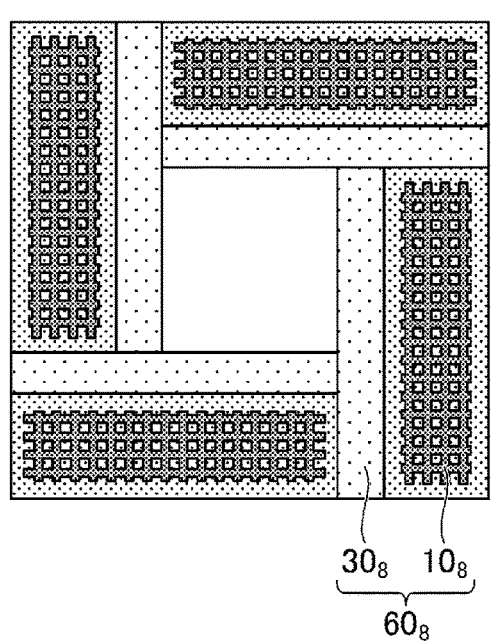
Figure 25C:
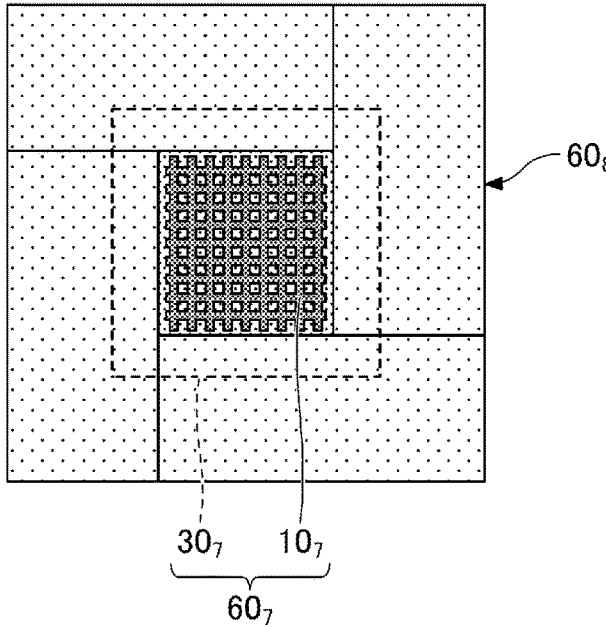

FIG. 25A through FIG. 25C are plan views of a semiconductor device according to a fourth application example of the first embodiment. Referring to FIG. 25A through FIG. 25C, a semiconductor device 1F according to the fourth application example of the first embodiment includes one stack $60_7$ and four stacks $60_8$. In the stack $60_7$, a power supply and ground layer $10_7$ and a semiconductor chip $30_7$ are stacked, and in each of the stacks $60_8$, a power supply and ground layer $10_8$ and a semiconductor chip $30_8$ are stacked.

As illustrated in FIG. 25A, in the stack $60_7$, the power supply and ground layer $10_7$ is stacked at the center of one surface of the semiconductor chip $30_7$. The outer peripheral portion of the one surface of the semiconductor chip $30_7$ is exposed from the periphery of the power supply and ground layer $10_7$.

As illustrated in FIG. 25B, in each of the stacks $60_8$, the semiconductor chip $30_8$ is larger than the power supply and ground layer $10_8$, and a portion of the semiconductor chip $30_8$ extends beyond the end portion of the power supply and ground layer $10_8$. The four stacks $60_8$ are prepared.

The four stacks $60_8$ are disposed as illustrated in FIG. 25B, and the top and bottom of each of the stacks $60_8$ are inverted. Then, the four stacks $60_8$ are stacked on the stack $60_7$, and as a result, a semiconductor device 1F is obtained as illustrated in FIG. 25C. In the semiconductor device 1F, the outer peripheral portion of the one surface of the semiconductor chip $30_7$, which is exposed from the power supply and ground layer $10_7$, contacts the extended portions of the semiconductor chip $30_8$ of the stacks $60_8$. In regions where the exposed outer peripheral portion of the semiconductor chip $30_7$ contacts the extended portions of the semiconductor chips $30_8$, the semiconductor chip $30_7$ is electrically connected to the semiconductor chips $30_8$. The semiconductor chip $30_7$ and the semiconductor chips $30_8$ may be connected face-to-face or face-to-back.

The semiconductor chip $30_7$ of the stack $60_7$ may be, for example, an MPU chip or a GPU chip. Further, the semiconductor chips $30_8$ of the stacks $60_8$ are, for example, SRAM chips. That is, an MPU chip or a GPU chip is disposed at the center of the semiconductor device 1F, and four SRAM chips are disposed around the MPU chip or the GPU chip. Alternatively, a SRAM chip may be disposed at the center of the semiconductor device 1F, and various processor chips may be disposed around the SRAM chip.

Similar to the semiconductor device 1C, in the semiconductor device 1F, the area of non-overlapping portions of the semiconductor chip $30_7$ and the semiconductor chips $30_8$ is larger than the area of overlapping portions of the semiconductor chip $30_7$ and the semiconductor chips $30_8$. The power supply and ground layers are disposed on the non-overlapping portions of the semiconductor chip $30_7$ and the semiconductor chips $30_8$. Therefore, it is possible to suppress the occurrence of hot spots in the semiconductor device 1F, thus allowing the heat dissipation of the entire semiconductor device 1F to be made uniform. In addition, because the area of each of the power supply and ground layers is increased, shortages of heat dissipation areas can be resolved. Therefore, heat can be efficiently dissipated from each of the power supply and ground layers.

Figure 26:
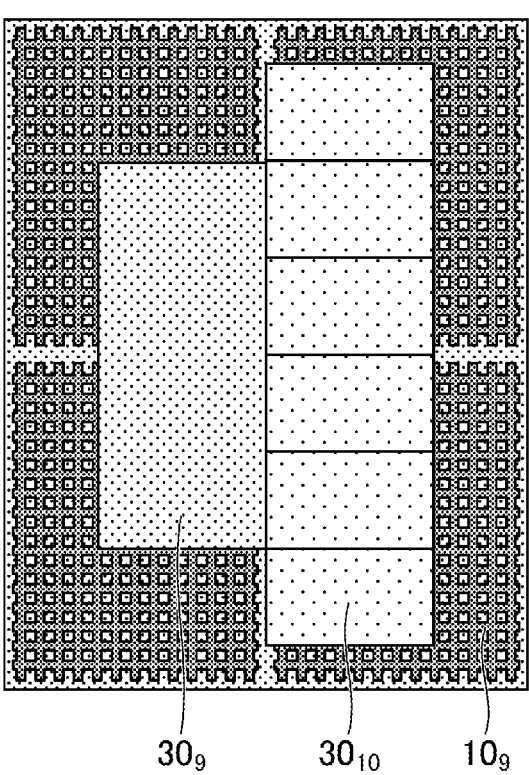
FIG. 26 is a plan view of a semiconductor device according to a fifth application example of the first embodiment.

FIG. 26 is a plan view of a semiconductor device according to a fifth application example of the first embodiment. Referring to FIG. 26, a semiconductor device 1G according to the fifth application example of the first embodiment includes one power supply and ground layer $10_9$, one semiconductor chip $30_9$, and six semiconductor chips $30_{10}$.

In the semiconductor device 1G, the power supply and ground layer $10_9$ includes wiring parts of four systems, which are insulated from each other. In this case, the wiring parts of the respective systems can be connected to power supply wiring of different systems of the semiconductor chip $30_9$ and the semiconductor chips $30_{10}$.

The four wiring parts are arranged in two rows and two columns. The semiconductor chip $30_9$ is disposed on one surface of each of two wiring parts arranged in the left column so as to be positioned across the two wiring parts. The six semiconductor chips $30_{10}$ are disposed on one surface of each of two wiring parts arranged in the right column so as to be positioned across the two wiring parts.

The semiconductor chip $30_9$ and the six semiconductor chips $30_{10}$ are smaller than the power supply and ground layer $10_9$ in a plan view. Thus, the outer peripheral portion of the power supply and ground layer $10_9$ is exposed from the semiconductor chip $30_9$ and the semiconductor chips $30_{10}$. The semiconductor chip $30_9$ may be, for example, a logic chip having a relatively low power supply voltage. Each of the semiconductor chips $30_{10}$ may be, for example, a SRAM chip having a relatively high power supply voltage.

As described above, a power supply and ground layer may be larger than mounted semiconductor chips in a plan view. With such a configuration, the heat dissipation of the power supply and ground layer can be improved. If a semiconductor device includes a connection wiring part 50 as illustrated in FIG. 21, the different semiconductor chips may be connected to each other by the connection wiring part 50. In this case, the capacitance of the connection wiring is lower in comparison to when the connection between semiconductor chips is packaged or is made via a silicon interposer. Therefore, the power consumption of the entire semiconductor device can be reduced. Further, the portion of the power supply and ground layer exposed from the semiconductor chips may be used as a contact for supplying power to the semiconductor device.

In each of the application examples of the first embodiment, a semiconductor chip disposed on a power supply and ground layer is not limited to one layer of a semiconductor chip, and may be a stack of semiconductor chips. Alternatively, a stack of semiconductor chips and one layer of a semiconductor chip may be combined.

Although specific embodiments have been described above, the present invention is not limited to the above-described embodiments. Various modifications and substitutions can be applied to the above-described embodiments without departing from the scope of the claims.

Further, in the above-described embodiments, an example of a semiconductor substrate (silicon wafer) having a circular shape in a plan view has been described. However, the shape of the semiconductor substrate is not limited to a circular shape in a plan view, and may be, for example, a panel shape such as a rectangular shape in a plan view.

What is claimed is:

1. A semiconductor device comprising:
   a power supply and ground layer, the power supply and ground layer including a substrate and a wiring part;
   a semiconductor chip disposed over the power supply and ground layer, the semiconductor chip including through-electrodes disposed inside the semiconductor chip; and
   a first insulating layer extending between the semiconductor chip and the power supply and ground layer,
   wherein the substrate has one or more grooves whose openings are directed toward the semiconductor chip, and the wiring part is disposed within the one or more grooves via a second insulating layer and is formed in a predetermined pattern,
   wherein the substrate is connected to ground wiring of the semiconductor chip and the wiring part is connected to power supply wiring of the semiconductor chip,
   wherein the wiring part is not exposed from a bottom portion of the substrate in a state in which the wiring part is covered by the bottom portion whose surface has been ground and polished such that the bottom portion of the substrate has a predetermined thickness, and
   wherein the through-electrodes penetrate through the first insulating layer.

2. The semiconductor device according to claim 1, wherein the predetermined pattern is a mesh pattern in a plan view.

3. The semiconductor device according to claim 2, wherein the substrate has a side wall portion and a plurality of columnar portions, the side wall portion surrounding the bottom portion, and the columnar portions being disposed in a region on the bottom portion surrounded by the side wall portion while being spaced apart from each other, and
   wherein the columnar portions are disposed within openings of the mesh pattern.

4. The semiconductor device according to claim 1, wherein a decoupling capacitor is formed by the substrate, the second insulating layer, and the wiring part.

5. The semiconductor device according to claim 1,
   wherein the substrate is connected to the ground wiring of the semiconductor chip and the wiring part is connected to the power supply wiring of the semiconductor chip by the through-electrodes, and
   wherein a total area of end faces of through-electrodes connected to the substrate or to the wiring part is 2% or more of an area of a back surface of the semiconductor chip.

6. The semiconductor device according to claim 1, wherein the substrate is formed of silicon, and a volume of the silicon is 60% or less of a total volume of the silicon and the wiring part.

7. The semiconductor device according to claim 6, wherein the wiring part includes a metal layer.

8. The semiconductor device according to claim 7, wherein the metal layer is porous.

9. The semiconductor device according to claim 6, wherein the wiring part includes a metal layer and a carbon layer, the metal layer being located closer to the semiconductor chip, and the carbon layer being located under the metal layer.

10. The semiconductor device according to claim 9, wherein an area of the carbon layer is 10% or more of a total area of the carbon layer and the metal layer in a vertical sectional view.

11. The semiconductor device according to claim 9, wherein the carbon layer includes carbon nanotubes or graphene pieces, and the metal layer includes copper.

12. The semiconductor device according to claim 1, further comprising a connection wiring part that is disposed between the power supply and ground layer and the semiconductor chip and includes higher density wiring than wiring of the wiring part.

13. The semiconductor device according to claim 1, further comprising a connection wiring part that includes higher density wiring than wiring of the wiring part, wherein the semiconductor chip includes a plurality of semiconductor chips disposed at different positions over the power supply and ground layer in a plan view, wherein the connection wiring part is disposed between the power supply and ground layer and each of the semiconductor chips, and wherein the semiconductor chips are connected to each other by the connection wiring part.

14. The semiconductor device according to claim 1, wherein the wiring part is divided into wiring parts of a plurality of systems in a plan view, the wiring parts being isolated from each other, and wherein the wiring parts of the respective systems are connected to power supply wiring of different systems of the semiconductor chip.

15. The semiconductor device according to claim 1, wherein the power supply and ground layer is larger than the semiconductor chip in a plan view.

\* \* \* \* \*